(12) United States Patent
Gunasekaran et al.

(10) Patent No.: US 12,388,449 B2
(45) Date of Patent: Aug. 12, 2025

(54) QUANTIZATION EXTRACTION FOR PHASE-LOCKED LOOP OSCILLATORS

(71) Applicant: Texas Instruments Incorporated, Dallas, TX (US)

(72) Inventors: Karthikeyan Gunasekaran, Bangalore (IN); Jagannathan Venkataraman, Bangalore (IN); Shalu Francis, Kozhikode (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 53 days.

(21) Appl. No.: 18/395,109

(22) Filed: Dec. 22, 2023

(65) Prior Publication Data

US 2025/0211242 A1    Jun. 26, 2025

(51) Int. Cl.
| | |
|---|---|
| H03L 7/099 | (2006.01) |
| G09G 3/20 | (2006.01) |
| H03K 19/20 | (2006.01) |
| H03L 7/087 | (2006.01) |
| H03L 7/18 | (2006.01) |

(52) U.S. Cl.
CPC ........... *H03L 7/099* (2013.01); *G09G 3/2096* (2013.01); *H03K 19/20* (2013.01); *H03L 7/087* (2013.01); *H03L 7/18* (2013.01)

(58) Field of Classification Search
CPC ... H03L 7/1974; H03L 7/1978; H03L 7/1976; H03L 7/199; H03L 7/197; H03L 7/18; H03L 7/06
See application file for complete search history.

(56) References Cited

U.S. PATENT DOCUMENTS

| | | | | |
|---|---|---|---|---|
| 7,570,182 B2 * | 8/2009 | Sheba | .................... | G04F 10/005 341/118 |
| 8,183,936 B2 * | 5/2012 | Chen | ......................... | H03L 7/16 375/376 |

OTHER PUBLICATIONS

Galton, "Delta-Sigma Fractional-N Phase-Locked Loops," Ian Galton, 2017, 11 pages.
Murphy et al., "A Calibration-Free Fractional-N Analog PLL With Negligible DSM Quantization Noise," IEEE, IEEE Journal of Solid-State Circuits, vol. 58, No. 9, Sep. 2023, 13 pages.

(Continued)

*Primary Examiner* — Diana J. Cheng
(74) *Attorney, Agent, or Firm* — Mandy Barsilai Fernandez; Frank D. Cimino

(57) ABSTRACT

An example apparatus includes quantization feedback circuitry (QFC) including an input terminal coupled to an output terminal of voltage-controlled oscillator (VCO) circuitry and an input terminal coupled to an output terminal of first frequency divider circuitry (FDC). The example apparatus also includes second FDC including an output terminal coupled to an input terminal of phase frequency detector (PFD) circuitry and an input terminal coupled to an output terminal of the first FDC. Also, the example apparatus includes masking logic circuitry including an output terminal coupled to an input terminal of the QFC, an input terminal coupled to the output terminal of the VCO circuitry, and an input terminal coupled to the output terminal of the second FDC. The example apparatus also includes adder circuitry including an input terminal coupled to an output terminal of the PFD circuitry and an input terminal coupled to an output terminal of the QFC.

20 Claims, 16 Drawing Sheets

(56) References Cited

OTHER PUBLICATIONS

Yang et al., "A Harmonic-Mixing PLL Architecture for Millimeter-Wave Application," IEEE, IEEE Journal of Solid-State Circuits, vol. 57, No. 12, Dec. 2022, 15 pages.

Azarian et al., "A Simple Method to Accurately Predict PLL Reference Spur Levels Due to Leakage Current," Linear Technology, Application Note 143, Dec. 2013, 8 pages.

Sandireddy et al., "A Generic Architecture for Multi-Modulus Dividers in Low-Power and High-Speed Frequency Synthesis," IEEE, 2004 Topical Meeting on Silicon Monolithic Integrated Circuits in RF Systems, 2004, 4 pages.

Wikipedia, "Charge pump," Wikipedia Foundation, Inc., [https://en.wikipedia.org/w/index.php?title=Charge_pump&oldid=1186809169] retrieved on Nov. 27, 2023, 5 pages.

Wikipedia, "Delta-sigma modulation," Wikipedia Foundation, Inc., [https://en.wikipedia.org/w/index.php?title=Delta-sigma_modulation&oldid=1177458911] retrieved on Nov. 27, 2023, 15 pages.

Texas Instruments, "DS90UB638-Q1 FPD-Link III 4.16-Gbps Single Input Deserializer With MIPI CSI-2 Output," SNLS708, Feb. 2023, 142 pages.

Wikipedia, "Dual-modulus prescaler," Wikipedia Foundation, Inc., [https://en.wikipedia.org/w/index.php?title=Dual-modulus_prescaler&oldid=1167737610] retrieved on Nov. 29, 2023, 3 pages.

Wikipedia, "FPD-Link," Wikipedia Foundation, Inc., [https://en.wikipedia.org/w/index.php?title=FPD-Link&oldid=1176962201] retrieved on Nov. 27, 2023, 4 pages.

Wikipedia, "Frequency divider," Wikipedia Foundation, Inc., [https://en.wikipedia.org/w/index.php?title=Frequency_divider&oldid=1175953211] retrieved on Nov. 29, 2023, 4 pages.

Mikkelsen, "Fractional-N PLL-Based Frequency Synthesis through Sigma-Delta Modulation of the Reference Clock Frequency," Ottawa-Carleton Institute for Electrical and Computer Engineering, Thesis submitted to the Faculty of Graduate and Postdoctoral Affairs, Jan. 2021, 107 pages.

Wikipedia, "Netlist," Wikipedia Foundation, Inc., [https://en.wikipedia.org/w/index.php?title=Netlist&oldid=1090603567] retrieved on Nov. 27, 2023, 4 pages.

Wikipedia, "Phase detector," Wikipedia Foundation, Inc., [https://en.wikipedia.org/w/index.php?title=Phase_detector&oldid=1182606630] retrieved on Nov. 27, 2023, 6 pages.

Wikipedia, "Phase-locked loop," Wikipedia Foundation, Inc., [https://en.wikipedia.org/w/index.php?title=Phase-locked_loop&oldid=1184929963] retrieved on Nov. 27, 2023, 18 pages.

Zhang et al., "A Fractional-N PLL With Space-Time Averaging for Quantization Noise Reduction," IEEE, IEEE Journal of Solid-State Circuits, vol. 55, No. 3, Mar. 2020, 13 pages.

Texas Instruments, "AN-1865 Frequency Synthesis and Planning for PLL Architectures," Application Report, SNAA061C, Jun. 2008, Revised Apr. 2013, 14 pages.

Texas Instruments, "AN-1879 Fractional N Frequency Synthesis," SNAA062B, Apr. 2013, Revised Nov. 2021, 28 pages.

Wikipedia, "Voltage-controlled oscillator," Wikipedia Foundation, Inc., [https://en.wikipedia.org/w/index.php?title=Voltage-controlled_oscillator&oldid=1180068020] retrieved on Nov. 27, 2023, 6 pages.

* cited by examiner

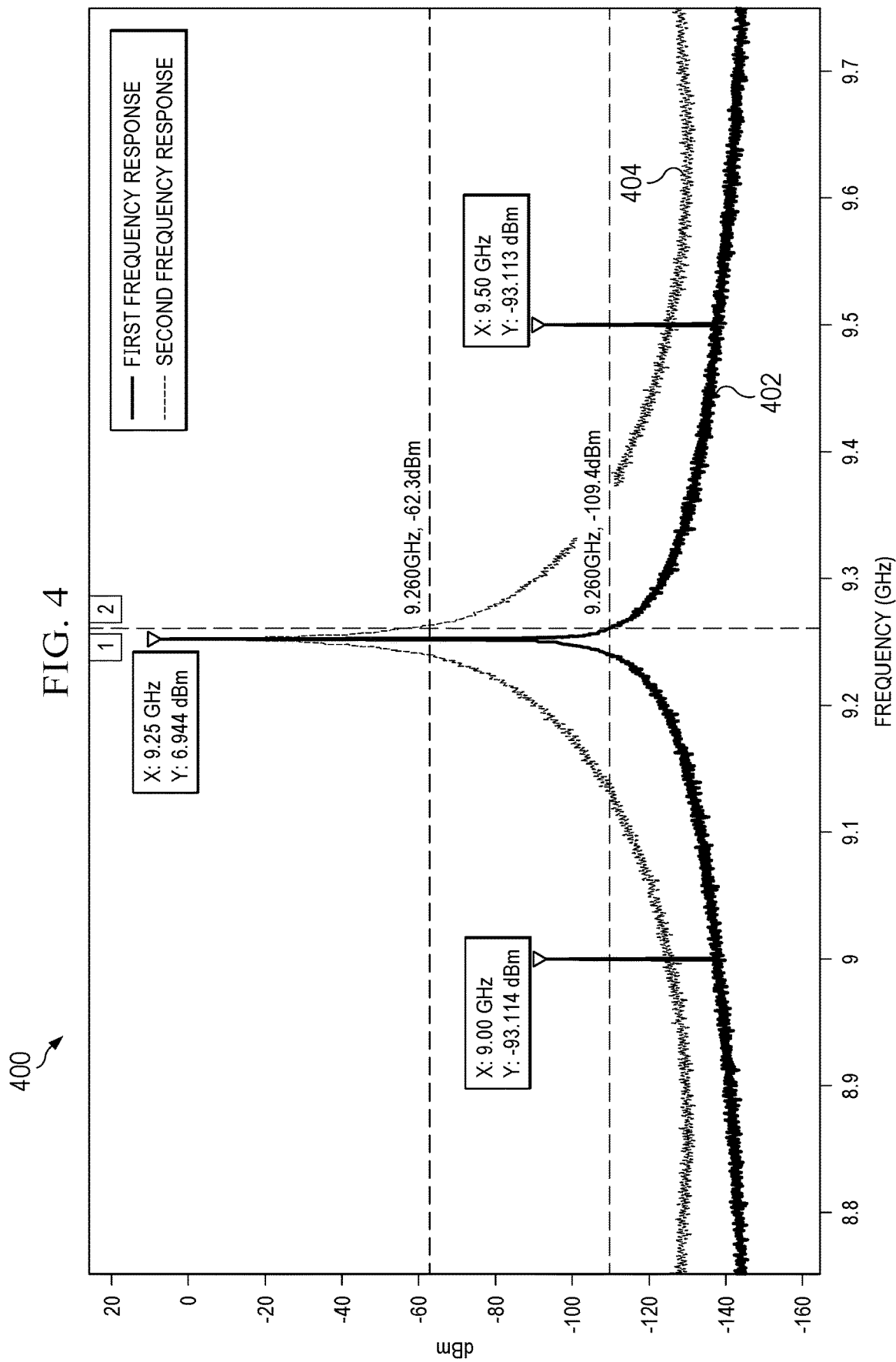

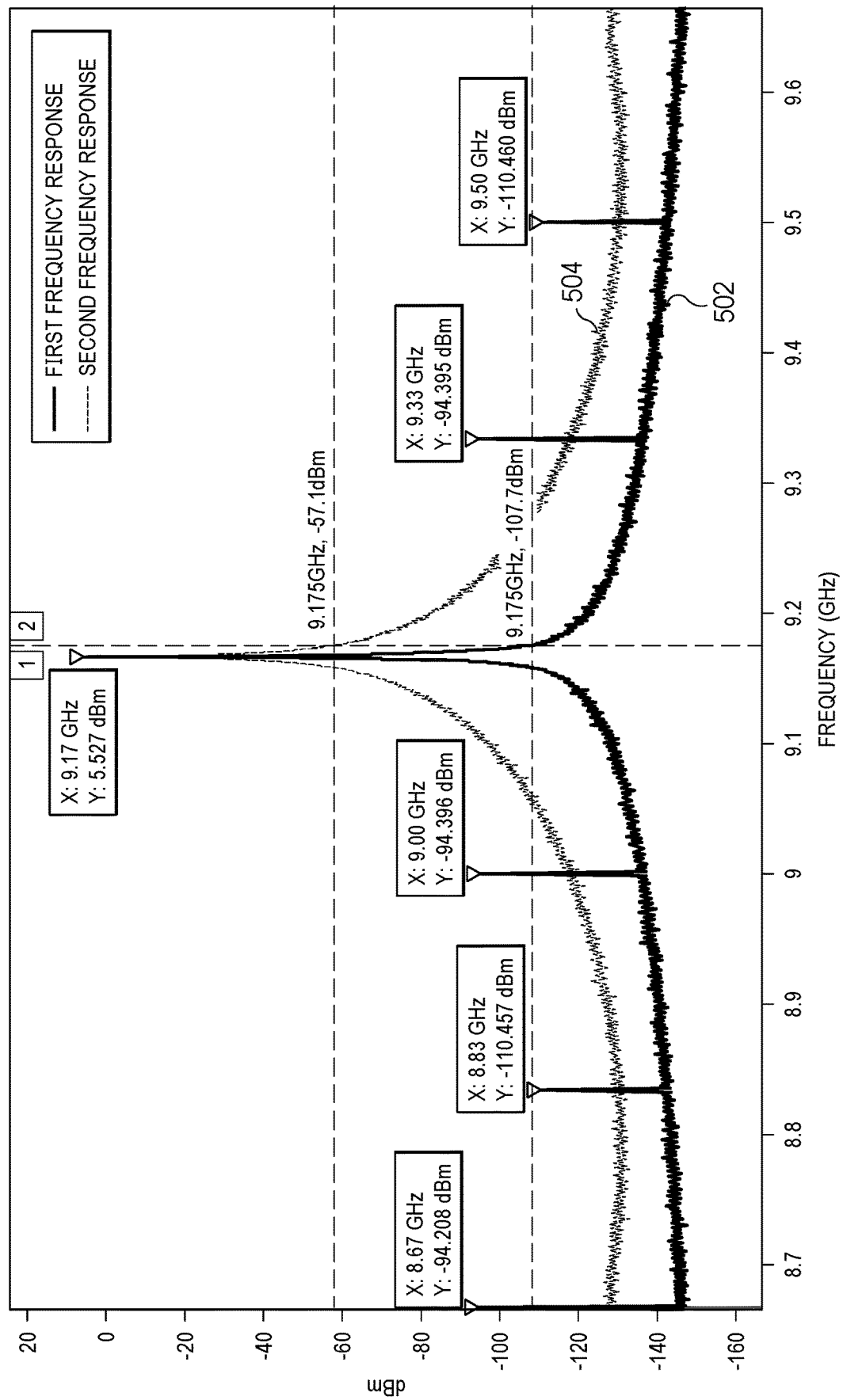

QUANTIZATION EXTRACTION FOR PHASE-LOCKED LOOP OSCILLATORS

TECHNICAL FIELD

This description relates generally to oscillators and, more particularly, to methods, apparatus, and articles of manufacture that use quantization extraction in phase-locked loop oscillators.

BACKGROUND

Many electronic devices (e.g., transmitters, receivers, television sets, computers, computer peripherals, mobile devices, etc.) include electronic oscillators. An electronic oscillator is an electric circuit that generates a periodic, oscillating or alternating current (AC) signal powered by a direct current (DC) source. An electronic oscillator may be implemented as at least one of a linear (e.g., a harmonic) oscillator, or a nonlinear (e.g., relaxation) oscillator. A linear oscillator may be implemented by a crystal oscillator. A nonlinear oscillator may be implemented by at least one of a multivibrator, a Pearson-Anson oscillator, a ring oscillator, a delay-line oscillator, or a Royer oscillator. A voltage-controlled oscillator (VCO) can be implemented by at least one of a linear oscillator or a non-linear oscillator. VCOs are utilized in phase-locked loop (PLL) oscillators.

SUMMARY

For methods, apparatus, and articles of manufacture that use quantization extraction in phase-locked loop oscillators, an example apparatus includes voltage-controlled oscillator (VCO) circuitry including an output terminal and an input terminal and first frequency divider circuitry including a first output terminal, a second output terminal, and an input terminal coupled to the output terminal of the VCO circuitry. Also, the example apparatus includes quantization feedback circuitry including an output terminal, a first input terminal, a second input terminal, and a third input terminal, the first input terminal of the quantization feedback circuitry coupled to the output terminal of the VCO circuitry, the second input terminal of the quantization feedback circuitry coupled to the first output terminal of the first frequency divider circuitry. The example apparatus also includes second frequency divider circuitry including an output terminal and an input terminal coupled to the second output terminal of the first frequency divider circuitry and phase frequency detector (PFD) circuitry including an output terminal and an input terminal coupled to the output terminal of the second frequency divider circuitry. Also, the example apparatus includes masking logic circuitry including an output terminal coupled to the third input terminal of the quantization feedback circuitry, a first input terminal coupled to the output terminal of the VCO circuitry, and a second input terminal coupled to the output terminal of the second frequency divider circuitry. The example apparatus also includes adder circuitry including an output terminal coupled to the input terminal of the VCO circuitry, a first input terminal coupled to the output terminal of the PFD circuitry, and a second input terminal coupled to the output terminal of the quantization feedback circuitry.

For methods, apparatus, and articles of manufacture that use quantization extraction in phase-locked loop oscillators, an example apparatus includes voltage-controlled oscillator (VCO) circuitry including an output terminal and an input terminal and multi-modulus frequency divider (MMFD) circuitry including an output terminal and an input terminal coupled to the output terminal of the VCO circuitry. Also, the example apparatus includes second frequency divider circuitry including an output terminal and an input terminal coupled to the output terminal of the MMFD circuitry and first phase frequency detector (PFD) circuitry including an output terminal and an input terminal coupled to the output terminal of the second frequency divider circuitry. The example apparatus also includes quantization extraction circuitry including an output terminal, a first input terminal coupled to the output terminal of the VCO circuitry, and a second input terminal coupled to the output terminal of the MMFD circuitry. Also, the example apparatus includes switching circuitry including an output terminal, a first input terminal, and a second input terminal, the first input terminal of the switching circuitry coupled to the output terminal of the quantization extraction circuitry. The example apparatus also includes second PFD circuitry including an output terminal and an input terminal coupled to the output terminal of the switching circuitry and masking logic circuitry including an output terminal coupled to the second input terminal of the switching circuitry, a first input terminal coupled to the output terminal of the VCO circuitry, and a second input terminal coupled to the output terminal of the second frequency divider circuitry. Also, the example apparatus includes adder circuitry including an output terminal coupled to the input terminal of the VCO circuitry, a first input terminal coupled to the output terminal of the first PFD circuitry, and a second input terminal coupled to the output terminal of the second PFD circuitry.

For methods, apparatus, and articles of manufacture that use quantization extraction in phase-locked loop oscillators, an example apparatus includes voltage-controlled oscillator (VCO) circuitry including an output terminal and an input terminal and multi-modulus frequency divider (MMFD) circuitry including an output terminal, a first input terminal, and a second input terminal, the first input terminal of the MMFD circuitry coupled to the output terminal of the VCO circuitry. Also, the example apparatus includes second frequency divider circuitry including an output terminal and an input terminal coupled to the output terminal of the MMFD circuitry and phase frequency detector (PFD) circuitry including an output terminal and an input terminal coupled to the output terminal of the second frequency divider circuitry. The example apparatus also includes delta-sigma modulator (DSM) circuitry including an output terminal coupled to the second input terminal of the MMFD circuitry and an input terminal coupled to the output terminal of the MMFD circuitry. Also, the example apparatus includes quantization extraction circuitry including an output terminal, a first input terminal coupled to the output terminal of the VCO circuitry, and a second input terminal coupled to the output terminal of the DSM circuitry. The example apparatus also includes switching circuitry including an output terminal, a first input terminal, and a second input terminal, the first input terminal of the switching circuitry coupled to the output terminal of the quantization extraction circuitry. Also, the example apparatus includes masking logic circuitry including an output terminal coupled to the second input terminal of the switching circuitry, a first input terminal coupled to the output terminal of the VCO circuitry, and a second input terminal coupled to the output terminal of the second frequency divider circuitry. The example apparatus also includes adder circuitry including an output terminal coupled to the input terminal of the VCO circuitry, a first input terminal coupled to the output terminal of the PFD circuitry, and a second input terminal coupled to the output terminal of the switching circuitry.

For methods, apparatus, and articles of manufacture that use quantization extraction in phase-locked loop oscillators, an example method includes generating a first quantization feedback signal and a second quantization feedback signal based on a masking signal, the first quantization feedback signal and the second quantization feedback signal to capture quantization information present in a frequency divider output signal. The example method also includes generating the masking signal based on a feedback signal, the masking signal to mask redundant information present in the quantization information, the feedback signal based on the frequency divider output signal.

BRIEF DESCRIPTION OF THE DRAWINGS

FIG. 4 is a graphical illustration depicting an example first frequency response of the clock generation circuitry of FIG. 2 compared to an example second frequency response of other clock generation circuitry.

FIG. 5 is another graphical illustration depicting an example first frequency response of the clock generation circuitry of FIG. 2 compared to an example second frequency response of other clock generation circuitry.

The same reference numbers or other reference designators are used in the drawings to designate the same or similar (functionally, structurally, or structurally and functionally) features.

DETAILED DESCRIPTION

Figure 1:
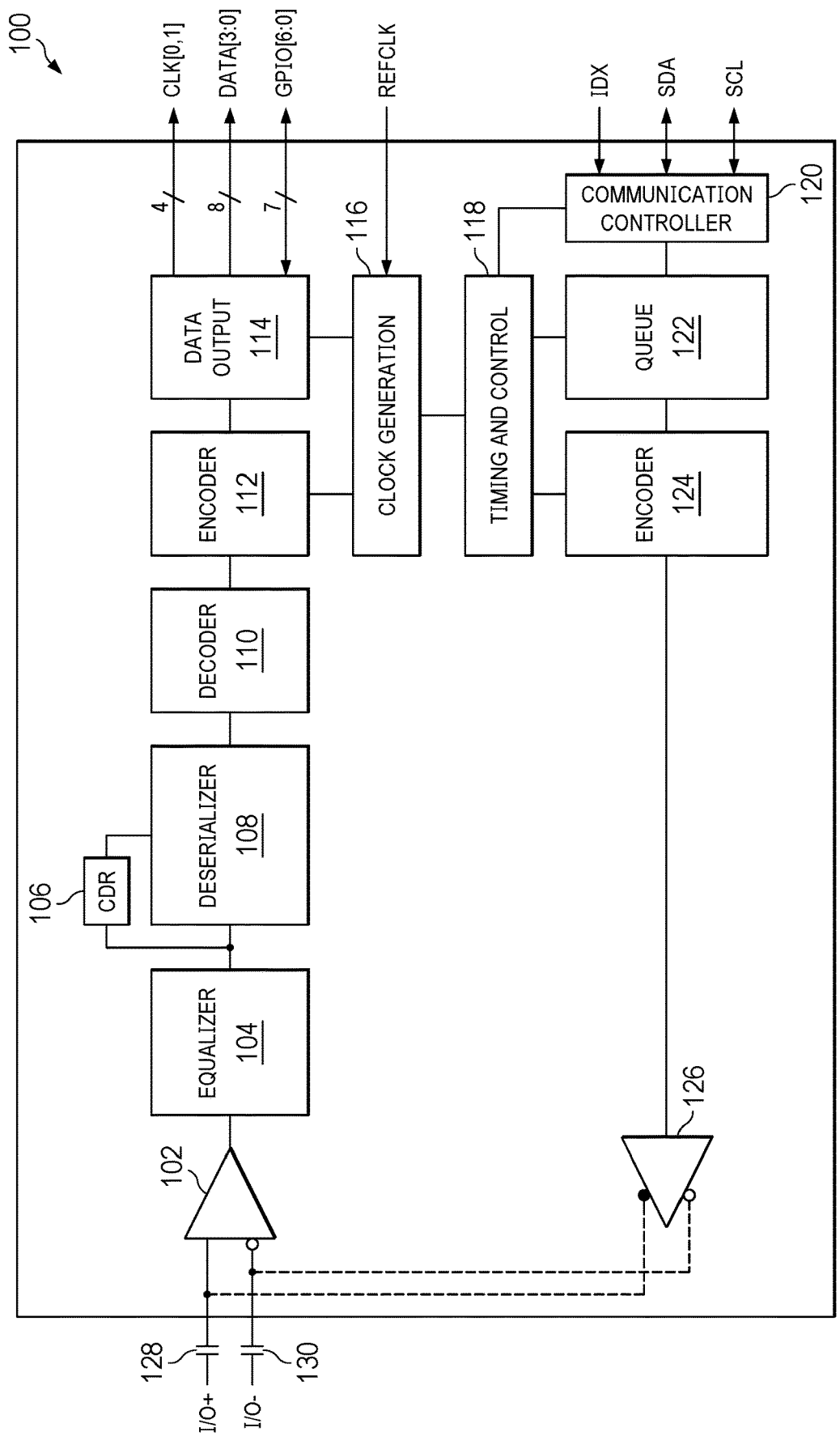
FIG. 1 is a block diagram of an example integrated circuit (IC) to deserialize an input stream of data including serialized data via a Flat Panel Display (FDP) Link interface.

The drawings are not necessarily to scale. Generally, the same reference numbers in the drawing(s) and this description refer to the same or like parts. Although the drawings show regions with clean lines and boundaries, some or all of these lines or boundaries may be idealized. In reality, the boundaries and lines may be unobservable, blended, or irregular.

Phase-locked loop (PLL) oscillators are implemented with a voltage-controlled oscillator (VCO). For example, a PLL oscillator (sometimes referred to as a PLL) may be implemented by a phase frequency detector (PFD) and a VCO. In example operation of a PLL, the VCO generates a periodic output signal with a specific frequency in response to an input voltage, the PFD compares the phase of the output signal to the phase of a reference input signal and generates an output signal representative of the comparison. The VCO adjusts the output signal responsive to the output signal from the PFD to match the phases. PLLs are utilized for computer clock synchronization, demodulation, and frequency synthesis in a variety of electronic applications such as radio, telecommunications, computer, and other electronic applications.

For example, PLLs are used to generate one or more clock signals for a graphics processing unit of an electronic device such as a laptop, a tablet computer, a flat panel display (e.g., in an automotive vehicle), or a television. In some examples, a timing controller of a display device communicates with a graphics processing unit of the display device using a standard such as Flat Panel Display (FPD) Link (FPD-Link). FPD-Link is frequently utilized for navigation systems, in-car entertainment, backup cameras, and driver-assistance systems in automotive vehicles. For example, FPD-Link provides a framework to communicate clock, data, and control signals between a parent device and one or more child devices.

In some examples, a transmitter and a receiver communicate through an FPD-Link interface operating at different rates to reduce cross talk. Cross talk may include interference caused by unintentional coupling to another communication channel. For example, a transmitter and a receiver operate at non-integer rates. In such examples, a transmitter and a receiver utilize fractional PLLs with reference frequencies of about 25 megahertz (MHz) and output frequencies of between six and 12 gigahertz (GHz). A fractional PLL generates an output signal with a frequency that is a non-integer multiple of the frequency of a reference signal. For a device to track drift in received data, the bandwidth of the PLL is large (e.g., 5-10 MHz).

Phase noise and reference spurs (e.g., harmonics in the frequency response on a PLL) can be amplified by frequency multiplication in PLLs. To combat noise amplification, some PLLs include a delta-sigma modulator (DSM) to "shape" the noise by moving the noise to a higher frequency range outside the range of interest of the PLLs. As such, the noise can be removed by low-pass filtering. However, such filtering is difficult to implement when operating in the gigahertz frequency range.

A first technique to address the presence of quantization noise in PLL output signals utilizes a multi-stage architecture including an integer PLL that generates an intermediary signal and provides the intermediary signal to a fractional PLL before generating an output signal. The first technique achieves sufficient quantization noise shaping for gigahertz operation due to the DSM operating at a higher frequency. However, the multi-stage nature of the first technique consumes more area on a semiconductor die and more power than other techniques.

A second technique to address the presence of quantization noise in PLL output signals utilizes multiple phase detectors implemented by multiple exclusive OR (XOR) gates that process the feedback signal in parallel. In the second technique, the number of XOR gates utilized is proportional to the multiplication factor of the PLL. However, if there is a delay mismatch in the transmission path to the multiple XOR gates, the second technique fails to shape quantization noise because the multiple phase detectors will operate on corrupted data (e.g., due to the mismatched delay). Also, because multiple XOR gates are utilized, a charge pump of the second technique may operate in a non-linear region which reduces the effect of quantization noise shaping.

Examples described herein include a fractional PLL that shapes quantization noise without consuming more area on a semiconductor die or more power than other techniques. Also, examples described herein maintain operation of charge pumps in the linear region independent of the multiplication factor of PLLs. Furthermore, examples described herein maintain quantization noise shaping even when delays are mismatched in transmission paths between circuitry.

FIG. 1 is a block diagram of an example integrated circuit (IC) 100 to deserialize an input stream of data including serialized data via an FDP-Link interface. In the example of FIG. 1, the IC 100 includes an example input buffer 102, example equalizer circuitry 104, example clock data recovery (CDR) circuitry 106, example deserializer circuitry 108, example decoder circuitry 110, example first encoder circuitry 112, example data output circuitry 114, example clock generation circuitry 116, example timing and control circuitry 118, example communication controller circuitry 120, example queue circuitry 122, example second encoder circuitry 124, and an example output buffer 126. In the example of FIG. 1, the IC 100 is a deserializer capable of receiving serialized sensor data from a source through an FPD-Link interface. When paired with a serializer, the IC 100 receives data from imagers, supporting cameras, satellite radio detecting and ranging (RADAR) sensors, and other sensors such as time-of-flight (ToF) sensors and light detection and ranging (LIDAR) sensors.

In the illustrated example of FIG. 1, the input buffer 102 buffers serialized sensor data received across differential input/output (I/O) terminals (e.g., I/O+ and I/O−) of the IC 100. In the example of FIG. 1, the input buffer 102 is implemented by combinational logic circuitry, sequential logic circuitry, or combinational logic circuitry and sequential logic circuitry. Also, a first input terminal of the input buffer 102 is coupled to a first capacitor 128. In the example of FIG. 1, a second input terminal of the input buffer 102 is coupled to a second capacitor 130. Also, an output terminal of the input buffer 102 is coupled to the equalizer circuitry 104.

In the illustrated example of FIG. 1, the equalizer circuitry 104 equalizes input signals to compensate for signal degradation (e.g., from communication channels, from interconnect circuitry, etc.). In the example of FIG. 1, the equalizer circuitry 104 is implemented by combinational logic circuitry, sequential logic circuitry, or combinational logic circuitry and sequential logic circuitry. Also, the input terminal of the equalizer circuitry 104 is coupled to the output terminal of the input buffer 102. In the example of FIG. 1, an output terminal of the equalizer circuitry 104 is coupled to an input terminal of the CDR circuitry 106 and a first input terminal of the deserializer circuitry 108.

In the illustrated example of FIG. 1, the CDR circuitry 106 extracts timing information from received serialized sensor data, allowing the timing of the serialized sensor data to be accurately determined without separate clock information. In the example of FIG. 1, the CDR circuitry 106 is implemented by combinational logic circuitry, sequential logic circuitry, or combinational logic circuitry and sequential logic circuitry. Also, the input terminal of the CDR circuitry 106 is coupled to the output terminal of the equalizer circuitry 104. In the example of FIG. 1, an output terminal of the CDR circuitry 106 is coupled to a second input terminal of the deserializer circuitry 108.

In the illustrated example of FIG. 1, the deserializer circuitry 108 deserializes serialized sensor data to format the sensor data into a data structure. In the example of FIG. 1, the deserializer circuitry 108 is implemented by combinational logic circuitry, sequential logic circuitry, or combinational logic circuitry and sequential logic circuitry. Also, the first input terminal of the deserializer circuitry 108 is coupled to the output terminal of the equalizer circuitry 104. In the example of FIG. 1, the second input terminal of the deserializer circuitry 108 is coupled to the output terminal of the CDR circuitry 106. Also, an output terminal of the deserializer circuitry 108 is coupled to an input terminal of the decoder circuitry 110.

In the illustrated example of FIG. 1, the decoder circuitry 110 decodes deserialized sensor data to determine a target for the deserialized sensor data. In the example of FIG. 1, the decoder circuitry 110 is implemented by combinational logic circuitry, sequential logic circuitry, or combinational logic circuitry and sequential logic circuitry. Also, the input terminal of the decoder circuitry 110 is coupled to the output terminal of the deserializer circuitry 108. In the example of FIG. 1, an output terminal of the decoder circuitry 110 is coupled to a first input terminal of the encoder circuitry 112.

In the illustrated example of FIG. 1, the encoder circuitry 112 encodes deserialized sensor data into an internal bus format to be transmitted the target. In the example of FIG. 1, the encoder circuitry 112 is implemented by combinational logic circuitry, sequential logic circuitry, or combinational logic circuitry and sequential logic circuitry. Also, the first input terminal of the encoder circuitry 112 is coupled to the output terminal of the decoder circuitry 110. In the example of FIG. 1, a second input terminal of the encoder circuitry 112 is coupled to a first output terminal of the clock generation circuitry 116. Also, an output terminal of the encoder circuitry 112 is coupled to a first input terminal of the data output circuitry 114.

In the illustrated example of FIG. 1, the data output circuitry 114 transmits the encoded sensor data to the target. In the example of FIG. 1, the data output circuitry 114 implements physical layer circuitry. Also, the first input terminal of the data output circuitry 114 is coupled to the output terminal of the encoder circuitry 112. In the example of FIG. 1, a second input terminal of the data output circuitry 114 is coupled to a second output terminal of the clock generation circuitry 116. Also, first output terminals of the data output circuitry 114 are coupled to an internal bus (e.g., to transmit clock data). In the example of FIG. 1, second output terminals of the data output circuitry 114 are coupled to an internal bus (e.g., to transmit encoded sensor data). Also, general purpose I/O (GPIO) terminals of the data output circuitry 114 are coupled to an internal bus.

In the illustrated example of FIG. 1, the clock generation circuitry 116 generates a clock signal for the IC 100. In the example of FIG. 1, the clock generation circuitry 116 is implemented by an example fractional PLL described herein. Also, the first output terminal of the clock generation circuitry 116 is coupled to the second input terminal of the encoder circuitry 112. In the example of FIG. 1, the second output terminal of the clock generation circuitry 116 is coupled to the second input terminal of the data output circuitry 114. Also, a third output terminal of the clock generation circuitry 116 is coupled to an input terminal of the timing and control circuitry 118. In the example of FIG. 1, an input terminal of the clock generation circuitry 116 is coupled to an oscillator (e.g., a crystal oscillator) to receive a reference clock signal (e.g., REFCLK).

In the illustrated example of FIG. 1, responsive to the clock signal, the timing and control circuitry 118 generates timing and control signals for the communication controller circuitry 120, the queue circuitry 122, and the encoder circuitry 124. In the example of FIG. 1, the timing and control circuitry 118 is implemented by combinational logic circuitry, sequential logic circuitry, or combinational logic circuitry and sequential logic circuitry. Also, the input terminal of the timing and control circuitry 118 is coupled to the third output terminal of the clock generation circuitry 116. In the example of FIG. 1, a first output terminal of the timing and control circuitry 118 is coupled to a first input terminal of the communication controller circuitry 120. In the example of FIG. 1, a second output terminal of the timing and control circuitry 118 is coupled to a first input terminal of the queue circuitry 122. Also, a third output terminal of the timing and control circuitry 118 is coupled to a first input terminal of the encoder circuitry 124.

In the illustrated example of FIG. 1, the communication controller circuitry 120 controls communication between the IC 100 and other devices over an internal bus. In the example of FIG. 1, the communication controller circuitry 120 is implemented by combinational logic circuitry, sequential logic circuitry, or combinational logic circuitry and sequential logic circuitry. Also, the first input terminal of the communication controller circuitry 120 is coupled to the first output terminal of the timing and control circuitry 118. In the example of FIG. 1, a second input terminal of the communication controller circuitry 120 is coupled to an internal bus to receive an identifier (ID) of a device communicating over the internal bus. Also, a first I/O terminal of the communication controller circuitry 120 is coupled to an internal bus to receive and transmit data to and from a device over the internal bus. In the example of FIG. 1, a second I/O terminal of the communication controller circuitry 120 is coupled to an internal bus to receive and transmit a clock signal to and from a device over the internal bus. Also, an output terminal of the communication controller circuitry 120 is coupled to a second input terminal of the queue circuitry 122.

In the illustrated example of FIG. 1, the queue circuitry 122 queues data received from a device over an internal bus. In the example of FIG. 1, the queue circuitry 122 is implemented by a first in, first out (FIFO) queue. Also, the first input terminal of the queue circuitry 122 is coupled to the second output terminal of the timing and control circuitry 118. In the example of FIG. 1, the second input terminal of the queue circuitry 122 is coupled to the output terminal of the communication controller circuitry 120. Also, an output terminal of the queue circuitry 122 is coupled to a second input terminal of the encoder circuitry 124.

In the illustrated example of FIG. 1, the encoder circuitry 124 encodes data into a serialized format to be transmitted to a serializer through an FPD-Link interface. In the example of FIG. 1, the encoder circuitry 124 is implemented by combinational logic circuitry, sequential logic circuitry, or combinational logic circuitry and sequential logic circuitry. Also, the first input terminal of the encoder circuitry 124 is coupled to the third output terminal of the timing and control circuitry 118. In the example of FIG. 1, a second input terminal of the encoder circuitry 124 is coupled to the output terminal of the queue circuitry 122. Also, an output terminal of the encoder circuitry 124 is coupled to an input terminal of the output buffer 126.

In the illustrated example of FIG. 1, the output buffer 126 buffers serialized data received from the encoder circuitry 124 and transmits the serialized data across the differential I/O terminals (e.g., I/O+ and I/O−) of the IC 100. In the example of FIG. 1, the output buffer 126 is implemented by combinational logic circuitry, sequential logic circuitry, or combinational logic circuitry and sequential logic circuitry. Also, the input terminal of the output buffer 126 is coupled to the output terminal of the encoder circuitry 124. In the example of FIG. 1, a first output terminal of the output buffer 126 is coupled to the capacitor 128. Also, a second output terminal of the output buffer 126 is coupled to the capacitor 130.

As described above, the IC 100 deserializes serialized sensor data. For example, the IC 100 is implemented with cameras, satellite RADAR sensors, ToF sensors, and LIDAR sensors. In some examples, the IC 100 is implemented with driver assistance systems such as those in autonomous vehicles (e.g., camera monitor systems, forward vision cameras, surround view systems, rear-view cameras, driver monitoring systems, side mirror displays, etc.). In some examples, the IC 100 is implemented with security sensors, surveillance sensors, industrial sensors, and medical imaging sensors.

Figure 2:
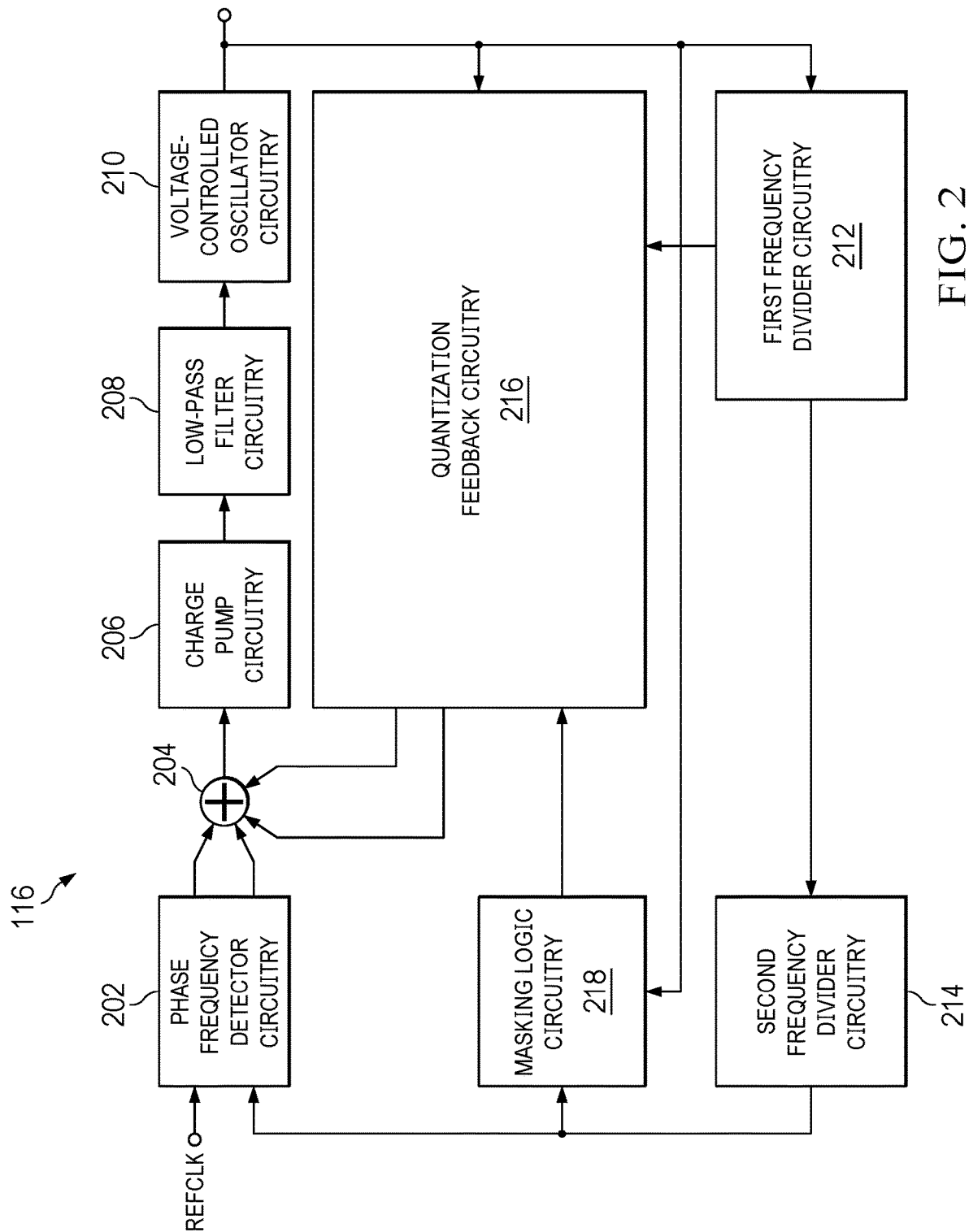
FIG. 2 is a block diagram of an example implementation of the clock generation circuitry of FIG. 1.

FIG. 2 is a block diagram of an example implementation of the clock generation circuitry 116 of FIG. 1. In the example of FIG. 2, the clock generation circuitry 116 includes example phase frequency detector (PFD) circuitry 202, example adder circuitry 204, example charge pump circuitry 206, example low-pass filter circuitry 208, example voltage-controlled oscillator (VCO) circuitry 210, example first frequency divider circuitry 212, example second frequency divider circuitry 214, example quantization feedback circuitry 216, and example masking logic circuitry 218. In the example of FIG. 2, the clock generation circuitry 116 generates an output signal with a frequency in the multi-gigahertz range (e.g., 6-12 GHz) with shaped quantization noise.

In the illustrated example of FIG. 2, the clock generation circuitry 116 includes a frequency extraction loop and a quantization extraction loop nested within the frequency extraction loop. For example, the frequency extraction loop includes the PFD circuitry 202, the adder circuitry 204, the charge pump circuitry 206, the low-pass filter circuitry 208, the VCO circuitry 210, the frequency divider circuitry 212, and the frequency divider circuitry 214. Also, for example, the quantization extraction loop includes the quantization feedback circuitry 216 and example masking logic circuitry 218. In the example of FIG. 2, circuitry of the feedback extraction loop operates to sample the output signal and compare at least one of the phase, frequency, or phase and frequency of the output signal to at least one of the phase, frequency, or phase and frequency of a reference signal. In the example of FIG. 2, circuitry of the quantization extraction loop extracts and preserves quantization information (e.g., one or more rising edges in the output signal) that is not retained in the frequency extraction loop.

In the illustrated example of FIG. 2, the PFD circuitry 202 compares a reference clock signal to a feedback signal that is based on the output signal of the clock generation circuitry 116. For example, the reference clock signal has a reference frequency ($F_{REF}$) of 500 MHz. In the example of FIG. 2, the PFD circuitry 202 is implemented by combinational logic circuitry, sequential logic circuitry, or combinational logic circuitry and sequential logic circuitry. Also, a first input terminal of the PFD circuitry 202 is coupled to an oscillator (e.g., a crystal oscillator) to receive the reference clock signal (e.g., REFCLK). In the example of FIG. 2, a second input terminal of the PFD circuitry 202 is coupled to an output terminal of the frequency divider circuitry 214. Also, a first output terminal and a second output terminal of the PFD circuitry 202 are coupled to a first input terminal and a second input terminal of the adder circuitry 204, respectively.

In the illustrated example of FIG. 2, the PFD circuitry 202 determines which of the reference clock signal and the feedback signal has a zero-crossing earlier or more often. For example, when the PFD circuitry 202 detects that the reference clock signal has a zero-crossing before the feedback signal, the PFD circuitry 202 generates a signal having a positive voltage at the first output terminal. Also, when the PFD circuitry 202 detects that the feedback signal has a zero-crossing before the reference clock signal, the PFD circuitry 202 generates a signal having a negative voltage at the second output terminal. In some example, the PFD circuitry 202 operates differently.

In the illustrated example of FIG. 2, the adder circuitry 204 adds voltages of signals output by the PFD circuitry 202 and the quantization feedback circuitry 216 to generate a charge pump control signal. In the example of FIG. 2, the adder circuitry 204 is implemented by combinational logic circuitry, sequential logic circuitry, or combinational logic circuitry and sequential logic circuitry. Also, the first input terminal and the second input terminal of the adder circuitry 204 are coupled to the first output terminal and the second output terminal of the PFD circuitry 202, respectively. In the example of FIG. 2, a third input terminal and a fourth input terminal of the adder circuitry 204 are coupled to a first output terminal and a second output terminal of the quantization feedback circuitry 216, respectively. Also, an output terminal of the adder circuitry 204 is coupled to an input terminal of the charge pump circuitry 206.

In the illustrated example of FIG. 2, the charge pump circuitry 206 generates a control signal for the VCO circuitry 210 responsive to the charge pump control signal generated by the adder circuitry 204. In the example of FIG. 2, the charge pump circuitry 206 is implemented by a bipolar switched current source. Also, the input terminal of the charge pump circuitry 206 is coupled to the output terminal of the adder circuitry 204. In the example of FIG. 2, an output terminal of the charge pump circuitry 206 is coupled to an input terminal of the low-pass filter circuitry 208.

In the illustrated example of FIG. 2, the low-pass filter circuitry 208 filters out (e.g., removes) frequencies higher than a cutoff frequency determined by the electronic components of the low-pass filter circuitry 208. In the example of FIG. 2, the low-pass filter circuitry 208 is implemented by a resistor capacitor (RC) circuit. Also, the input terminal of the low-pass filter circuitry 208 is coupled to the output terminal of the charge pump circuitry 206. In the example of FIG. 2, an output terminal of the low-pass filter circuitry 208 is coupled to an input terminal of the VCO circuitry 210. In example operation, the low-pass filter circuitry 208 filters the control signal generated by the charge pump circuitry 206 to generate a filtered control signal. In the example of FIG. 2, the cutoff frequency of the low-pass filter circuitry 208 is in the GHz range.

In the illustrated example of FIG. 2, the VCO circuitry 210 generates a VCO output signal responsive to the filtered control signal. For example, the VCO output signal has an output frequency ($F_{OUT}$) that is k times the reference frequency ($F_{REF}$). In the example of FIG. 2, k is 18.3. As such, the output frequency of the VCO output signal is 9.15 GHz (e.g., 18.3*500 MHz=9.15 GHz). In the example of FIG. 2, the VCO circuitry 210 is implemented by a linear oscillator, a non-linear oscillator, or a linear oscillator and a non-linear oscillator. Also, the input terminal of the VCO circuitry 210 is coupled to the output terminal of the low-pass filter circuitry 208. In the example of FIG. 2, an output terminal of the VCO circuitry 210 is coupled to an input terminal of the frequency divider circuitry 212, a first input terminal of the quantization feedback circuitry 216, and a first input terminal of the masking logic circuitry 218. Also, the output terminal of the VCO circuitry 210 operates as the output terminal of the clock generation circuitry 116. In example operation, the VCO circuitry 210 increases the frequency of the VCO output signal when the voltage of the filtered control signal increases. Also, the VCO circuitry 210 decreases the frequency of the VCO output signal when the voltage of the filtered control signal decreases. In some example, the VCO circuitry 210 operates with another relationship (e.g., an inverse relationship) to the voltage of the filtered control signal.

In the illustrated example of FIG. 2, the frequency divider circuitry 212 divides the frequency of the VCO output signal to generate a frequency divider output signal. In the example of FIG. 2, the frequency divider circuitry 212 is implemented by circuitry such as multi-modulus frequency divider (MMFD) circuitry and DSM circuitry. MMFD circuitry and DSM circuitry are described in further detail below. In the example of FIG. 2, the input terminal of the frequency divider circuitry 212 is coupled to the output terminal of the VCO circuitry 210. Also, a first output terminal of the frequency divider circuitry 212 is coupled to a second input terminal of the quantization feedback circuitry 216. In the example of FIG. 2, a second output terminal of the frequency divider circuitry 212 is coupled to an input terminal of the frequency divider circuitry 214. In some examples, the frequency divider circuitry 212 is referred to as first frequency divider circuitry (FDC).

In the illustrated example of FIG. 2, the frequency divider circuitry 212 switches between multiple moduli to divide the frequency of the VCO output signal. For example, the frequency divider circuitry 212 switches between m and m+1 to divide the frequency of the VCO output signal. In the example of FIG. 2, m is set to the largest integer value that is less than or equal to k/N (e.g., m=floor(k/N). For example, N is the modulus of the frequency divider circuitry 214. In the example of FIG. 2, N is six. As such, m is 3 and the frequency divider circuitry 212 switches between 3 and 4 to divide the frequency of the VCO output signal.

In the illustrated example of FIG. 2, the frequency divider circuitry 212 varies the amount of time that the frequency divider circuitry 212 divides the frequency of the VCO output signal by m and m+1 (e.g., 3 and 4) based on a DSM output signal. For example, the DSM circuitry of the frequency divider circuitry 212 receives an MMFD output signal having an MMFD output frequency and samples the MMFD output signal based on a fractional word input. In the example of FIG. 2, the MMFD output frequency is N times the frequency of the feedback signal (e.g., $F_{MMFD}$=6*500 MHz=3 GHz). Also, in the example of FIG. 2, the fractional word input to the DSM circuitry is set to the difference between k/N and the largest integer value that is less than or equal to k/N. As such, the fractional word input to the DSM circuitry is set to 0.05 (e.g., DSMm=(18.3/6)−floor(18.3/6) =3.05−3=0.05).

In the illustrated example of FIG. 2, the frequency divider circuitry 214 divides the frequency of the frequency divider output signal to generate the feedback signal. As described above, the frequency divider circuitry 214 divides the frequency of the frequency divider output signal by a single modulus, N, which is six in the example of FIG. 2. In the example of FIG. 2, the frequency divider circuitry 214 is implemented by an analog or digital frequency divider. For example, an analog frequency divider includes a regenerative frequency divider, an injection-locked frequency divider, etc. Also, for example, a digital frequency divider is implemented by one or more flipflops, one or more Johnson counters, etc. In the example of FIG. 2, the input terminal of the frequency divider circuitry 214 is coupled to the second output terminal of the frequency divider circuitry 212. Also, the output terminal of the frequency divider circuitry 214 is coupled to the second input terminal of the PFD circuitry 202 and a second input terminal of the masking logic circuitry 218. In some examples, the frequency divider circuitry 214 is referred to as second frequency divider circuitry (FDC).

In the illustrated example of FIG. 2, the quantization feedback circuitry 216 extracts quantization information present in the frequency divider output signal before the quantization information is removed by the frequency divider circuitry 214. For example, quantization information is indicative of rising edges present in the frequency divider output signal. In the example of FIG. 2, the quantization feedback circuitry 216 is implemented by one or more switches (e.g., transistors, diodes, etc.) and combinational logic circuitry, sequential logic circuitry, or combinational logic circuitry and sequential logic circuitry as described further herein. Also, the first input terminal of the quantization feedback circuitry 216 is coupled to the output terminal of the VCO circuitry 210. In the example of FIG. 2, the second input terminal of the quantization feedback circuitry 216 is coupled to the first output terminal of the frequency divider circuitry 212. Also, a third input terminal of the quantization feedback circuitry 216 is coupled to an output terminal of the masking logic circuitry 218. In the example of FIG. 2, the first output terminal and the second output terminal of the quantization feedback circuitry 216 are coupled to the third input terminal and the fourth input terminal of the adder circuitry 204, respectively. In some examples, the quantization feedback circuitry 216 is referred to as quantization feedback circuitry (QFC).

In the illustrated example of FIG. 2, the quantization feedback circuitry 216 generates a first quantization feedback signal at the first output terminal based on a masking signal generated by the masking logic circuitry 218. For example, the first quantization feedback signal has a positive voltage. In some examples, the quantization feedback circuitry 216 generates a second quantization feedback signal at the second output terminal based on the masking signal generated by the masking logic circuitry 218. For example, the second quantization feedback signal has a negative voltage.

In the illustrated example of FIG. 2, the masking logic circuitry 218 determines whether to generate the masking signal based on the feedback signal. For example, the masking signal masks redundant information present in the quantization information. In the example of FIG. 2, the masking logic circuitry 218 is implemented by combinational logic circuitry, sequential logic circuitry, or combinational logic circuitry and sequential logic circuitry as described further herein. Also, the first input terminal of the masking logic circuitry 218 is coupled to the output terminal of the VCO circuitry 210. In the example of FIG. 2, the second input terminal of the masking logic circuitry 218 is coupled to the output terminal of the frequency divider circuitry 214. Also, the output terminal of the masking logic circuitry 218 is coupled to the third input terminal of the quantization feedback circuitry 216. In example operation, when the same rising edge is present in both the feedback signal and the frequency divider output signal, the masking logic circuitry 218 generates the masking signal. As described further herein, the masking signal causes the quantization feedback circuitry 216 not to output at least one of the first quantization feedback signal or the second quantization feedback signal.

While an example manner of implementing the clock generation circuitry 116 of FIG. 1 is illustrated in FIG. 2, one or more of the elements, processes, or devices illustrated in FIG. 2 may be at least one of combined, divided, rearranged, omitted, eliminated, or implemented in any other way. Further, the example PFD circuitry 202, the example adder circuitry 204, the example charge pump circuitry 206, the example low-pass filter circuitry 208, the example VCO circuitry 210, the example frequency divider circuitry 212, the example frequency divider circuitry 214, the example quantization feedback circuitry 216, the example masking logic circuitry 218, or, more generally, the example clock generation circuitry 116 of FIG. 2, may be implemented by hardware alone or by hardware in combination with at least one of software or firmware.

Thus, for example, any of the example PFD circuitry 202, the example adder circuitry 204, the example charge pump circuitry 206, the example low-pass filter circuitry 208, the example VCO circuitry 210, the example frequency divider circuitry 212, the example frequency divider circuitry 214, the example quantization feedback circuitry 216, the example masking logic circuitry 218, or, more generally, the example clock generation circuitry 116 of FIG. 2, could be implemented by at least one of programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs.

Further still, the example clock generation circuitry 116 of FIG. 2 may include one or more elements, processes, or devices in addition to, or instead of, those illustrated in FIG. 2, and may include more than one of any or all of the illustrated elements, processes, and devices.

Figure 3:
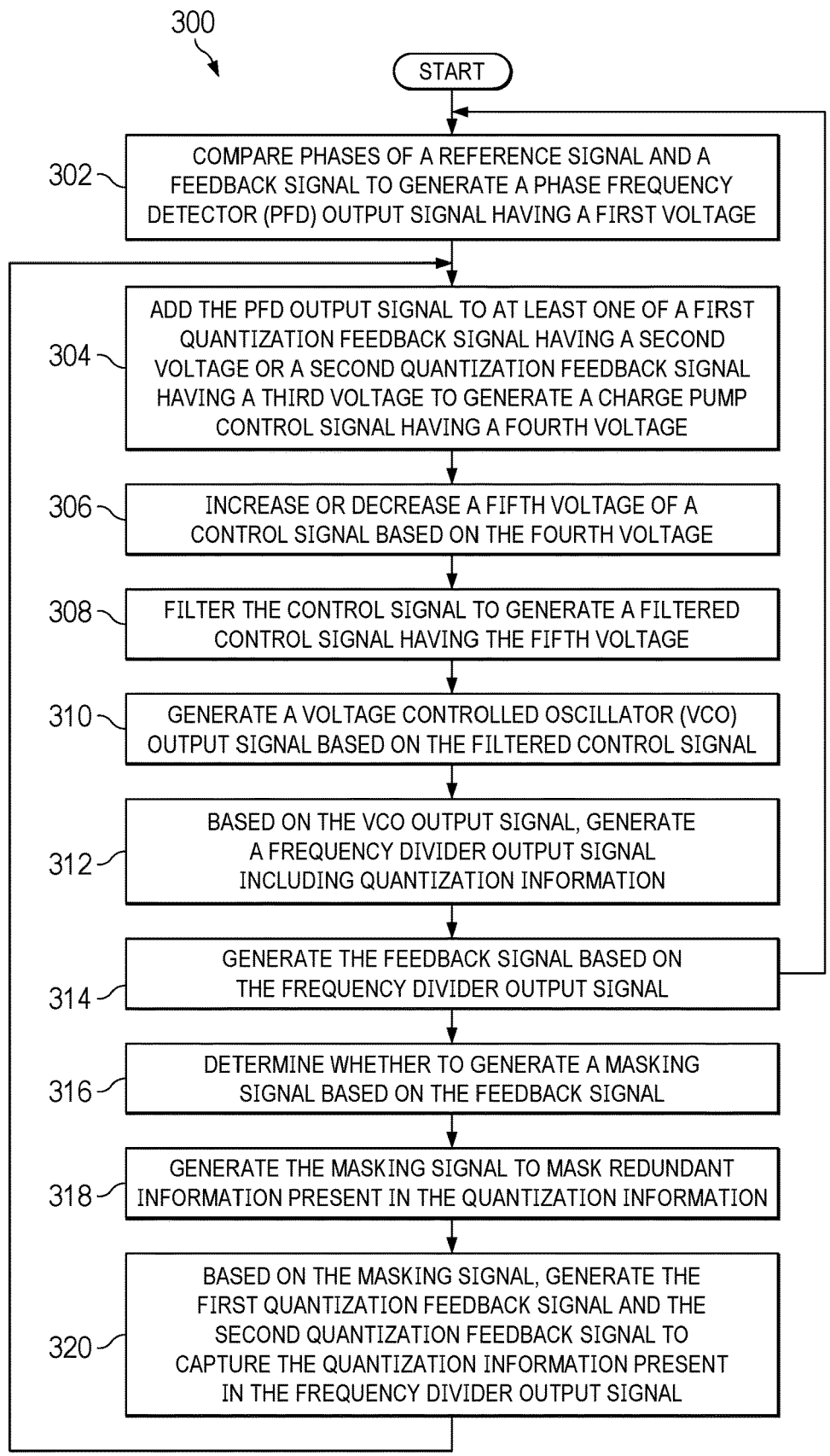
FIG. 3 is a flowchart representative of example machine-readable instructions or example operations that may be executed, instantiated, or performed using an example programmable circuitry implementation of the clock generation circuitry of FIG. 2.

FIG. 3 is a flowchart representative of example machine-readable instructions or example operations 300 that may be executed, instantiated, or performed using an example programmable circuitry implementation of the clock generation circuitry 116 of FIG. 2. The example machine-readable instructions or the example operations 300 of FIG. 3 begin at block 302, at which the PFD circuitry 202 compares phases of a reference signal and a feedback signal to generate a PFD output signal having a first voltage. At block 304, the adder circuitry 204 adds the PFD output signal to at least one of a first quantization feedback signal having a second voltage or a second quantization feedback signal having a third voltage. For example, the adder circuitry adds the PFD output signal to at least one of the first quantization feedback signal or the second quantization feedback signal to generate a charge pump control signal having a fourth voltage.

In the illustrated example of FIG. 3, at block 306, the charge pump circuitry 206 increases or decreases a fifth voltage of a control signal based on the fourth voltage of the charge pump control signal. At block 308, the low-pass filter circuitry 208 filters the control signal to generate a filtered control signal having the fifth voltage. In the example of FIG. 3, the VCO circuitry 210 generates a VCO output signal based on the filtered control signal at block 310. At block 312, based on the VCO output signal, the frequency divider circuitry 212 generates a frequency divider output signal including quantization information. For example, quantization information is indicative of rising edges present in the frequency divider output signal.

In the illustrated example of FIG. 3, at block 314, the frequency divider circuitry 214 generates the feedback signal based on the frequency divider output signal. In the example of FIG. 3, after block 314, the PFD circuitry 202 compares phases of the reference signal and the feedback signal at block 302 to generate a PFD output signal having a first voltage. Also, after block 314, the masking logic circuitry 218 determines whether to generate a masking signal based on the feedback signal at block 316. In the example of FIG. 3, at block 318, the masking logic circuitry 218 generates the masking logic signal to mask redundant information present in the quantization information. For example, at block 318, the masking logic circuitry 218 generates a delayed feedback signal based on the feedback signal and compares the feedback signal to a delayed feedback signal to generate the masking signal. In some examples, at block 318, the masking logic circuitry 218 generates an inverted delayed feedback signal based on the feedback signal and compares the feedback signal to the inverted delayed feedback signal to generated the masking signal.

For example, redundant information is indicative of rising edges present in the frequency divider output signal and the feedback signal. At block 320, based on the masking signal, the quantization feedback circuitry 216 generates the first quantization feedback signal and the second quantization feedback signal to capture the quantization information present in the frequency divider output signal. After block 320, the adder circuitry 204 adds the PFD output signal to at least one of the first quantization feedback signal having the second voltage or the second quantization feedback signal having the third voltage to generate the charge pump control signal having the fourth voltage.

FIG. 4 is a graphical illustration 400 depicting an example first frequency response 402 of the clock generation circuitry 116 of FIG. 2 compared to an example second frequency response 404 of other clock generation circuitry. In the example of FIG. 4, the clock generation circuitry 116 utilizes a reference clock signal having a reference frequency ($F_{REF}$) of 500 MHz and generates an output signal having an output frequency ($F_{OUT}$) of 9.25 GHz. As such, the ratio (e.g., k) between the reference frequency and the output frequency is 18.5. Also, the frequency divider circuitry 212 of the clock generation circuitry 116 switches between 18 and 19 to divide the frequency of the VCO output signal to achieve a fractional modulus of 18.5.

In the illustrated example of FIG. 4, the DSM circuitry of the frequency divider circuitry 212 receives an MMFD output signal having an MMFD output frequency. For example, the MMFD output frequency is N times the frequency of the feedback signal (e.g., $F_{MMFD}$=6*500 MHz=3 GHz). Also, the modulus of the frequency divider circuitry 214 of the clock generation circuitry 116 is six (e.g., N=6). In the example of FIG. 4, the bandwidth of the clock generation circuitry 116 is 1.1 GHz. For example, because the PFD circuitry 202 operates as frequency detector, the clock generation circuitry 116 retains a large frequency range similar to that of integer PLLs. There are very low least common multiple (LCM) reference spurs (e.g., about −93 decibels (dB)) in the frequency response 402. In the example of FIG. 4, the frequency response 402 of the clock generation circuitry 116 is reduced by about 40 dB as compared to the frequency response 404 of other clock generation circuitry.

FIG. 5 is another graphical illustration 500 depicting an example first frequency response 502 of the clock generation circuitry 116 of FIG. 2 compared to an example second frequency response 504 of other clock generation circuitry. In the example of FIG. 5, the clock generation circuitry 116 utilizes a reference clock signal having a reference frequency ($F_{REF}$) of 500 MHz and generates an output signal having an output frequency ($F_{OUT}$) of 9.165 GHz. As such, the ratio (e.g., k) between the reference frequency and the output frequency is 18.33. Also, the frequency divider circuitry 212 of the clock generation circuitry 116 switches between 18 and 19 to divide the frequency of the VCO output signal to achieve a fractional modulus of 18.33.

In the illustrated example of FIG. 5, the DSM circuitry of the frequency divider circuitry 212 receives an MMFD output signal having an MMFD output frequency. For example, the MMFD output frequency is N times the frequency of the feedback signal (e.g., $F_{MMFD}$=6*500 MHz=3 GHz). Also, the modulus of the frequency divider circuitry 214 of the clock generation circuitry 116 is six (e.g., N=6). In the example of FIG. 5, the bandwidth of the clock generation circuitry 116 is 1.1 GHz. For example, because the PFD circuitry 202 operates as frequency detector, the clock generation circuitry 116 retains a large frequency range similar to that of integer PLLs. There are very low LCM reference spurs (e.g., about −94 dB and −110 dB) in the frequency response 502. In the example of FIG. 5, the frequency response 502 of the clock generation circuitry 116 is reduced by about 50 dB as compared to the frequency response 504 of other clock generation circuitry.

Figure 6A:
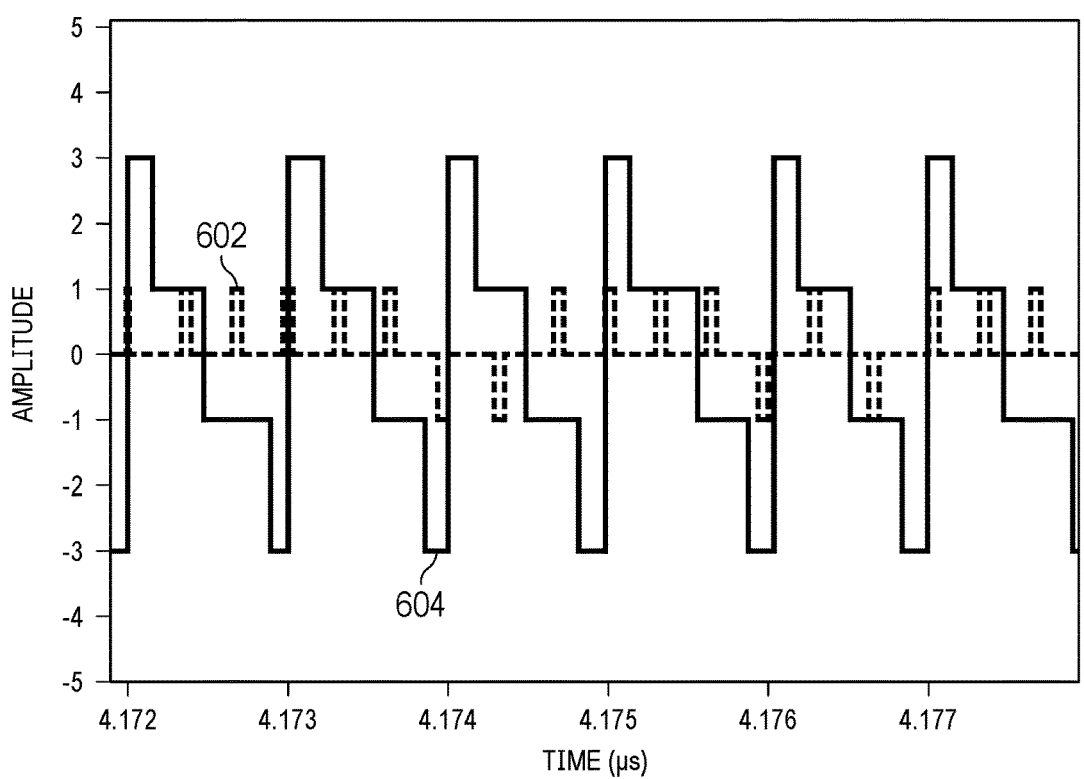
FIG. 6A is a graphical illustration depicting an example output signal of the adder circuitry of the clock generation circuitry of FIG. 2 compared to an example output signal of other clock generation circuitry.

FIG. 6A is a graphical illustration 600 depicting an example output signal 602 of the adder circuitry 204 of the clock generation circuitry 116 of FIG. 2 compared to an example output signal 604 of other clock generation circuitry. In the example of FIG. 6A, the integer modulus of the clock generation circuitry 116 (e.g., N) and the other clock generation circuitry is 3. As illustrated in FIG. 6A, the peak-to-peak amplitude of the output signal 602 of the adder circuitry 204 is two volts (e.g., 2V) whereas the peak-to-peak amplitude of the output signal 604 of the other clock generation circuitry is six volts (e.g., 6V).

Figure 6B:
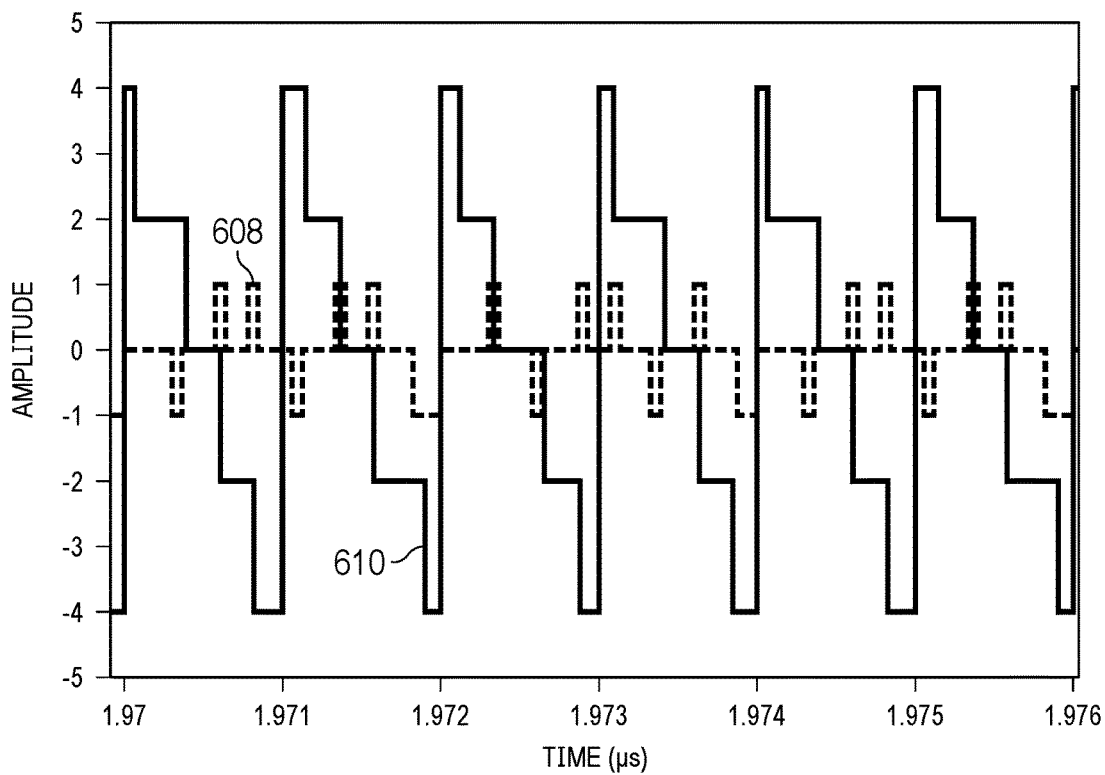
FIG. 6B is a graphical illustration depicting an example output signal of the adder circuitry of the clock generation circuitry of FIG. 2 compared to an example output signal of other clock generation circuitry.

FIG. 6B is a graphical illustration 606 depicting an example output signal 608 of the adder circuitry 204 of the clock generation circuitry 116 of FIG. 2 compared to an example output signal 610 of other clock generation circuitry. In the example of FIG. 6B, the integer modulus of the clock generation circuitry 116 (e.g., N) and the other clock generation circuitry is 4. As illustrated in FIG. 6B, the peak-to-peak amplitude of the output signal 608 of the adder circuitry 204 is two volts (e.g., 2V) whereas the peak-to-peak amplitude of the output signal 610 of the other clock generation circuitry is eight volts (e.g., 8V).

As illustrated in FIGS. 6A and 6B, regardless of the division factor in the frequency extraction loop of the clock generation circuitry 116, the clock generation circuitry 116 maintains the same peak-to-peak amplitude for the signal at the output terminal of the adder circuitry 204. As such, the clock generation circuitry 116 facilitates operation of the charge pump circuitry 206 in the linear region regardless of the division factor in the frequency extraction loop of the clock generation circuitry 116. Independent of the division factor, the output terminal of the adder circuitry 204 maintains the same peak-to-peak amplitude (e.g., −1 to +1) whereas in the other clock generation circuitry, the peak-to-peak amplitude varies based on the division factor (e.g., −N to +N).

Figure 7:
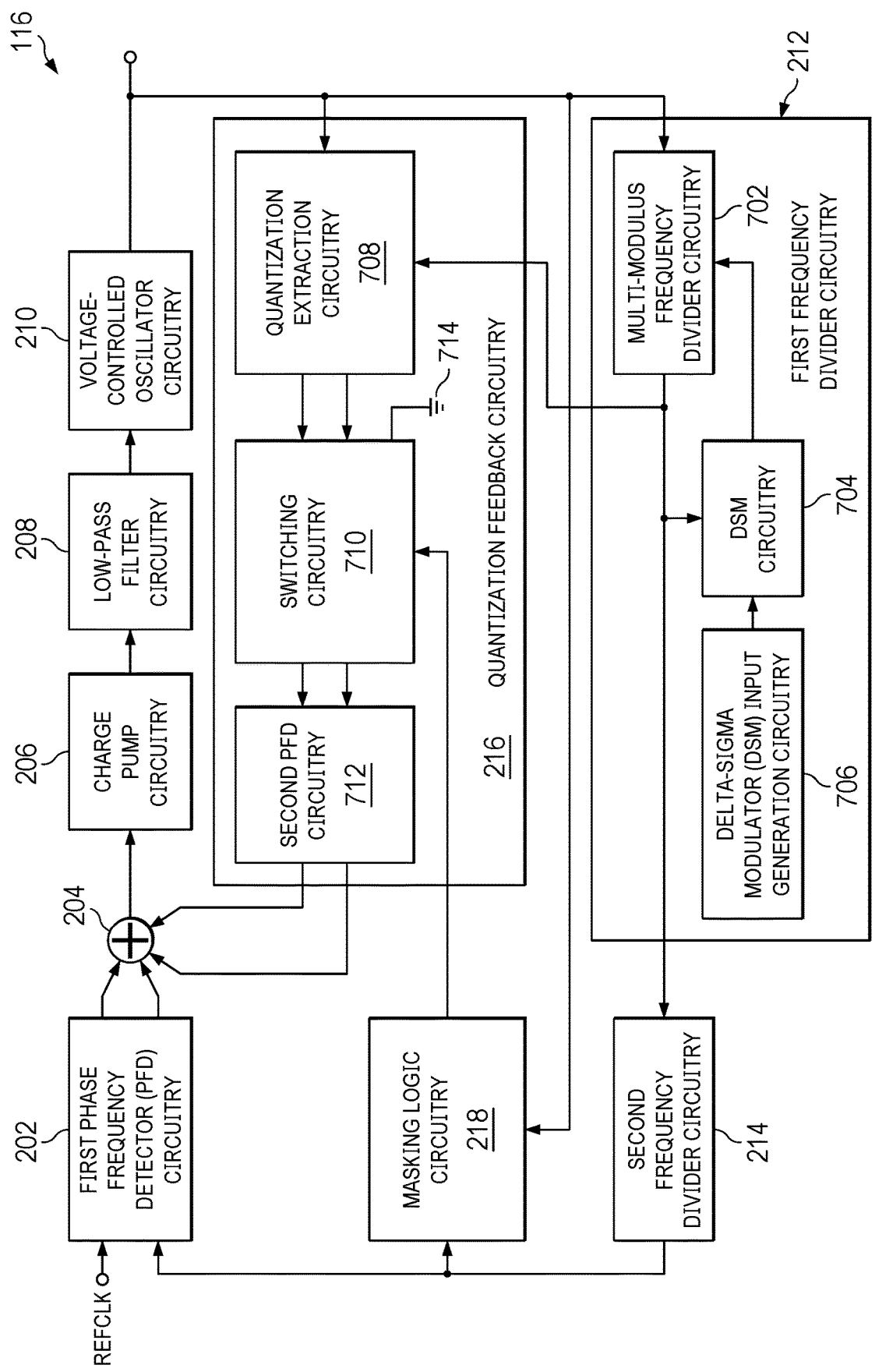
FIG. 7 is a block diagram of the clock generation circuitry of FIG. 2 including a first example implementation of the first frequency divider circuitry and the quantization feedback circuitry of FIG. 2.

FIG. 7 is a block diagram of the clock generation circuitry 116 of FIG. 2 including a first example implementation of the frequency divider circuitry 212 and the quantization feedback circuitry 216 of FIG. 2. In the example of FIG. 7, the frequency divider circuitry 212 includes example multi-modulus frequency divider (MMFD) circuitry 702, example delta-sigma modulator (DSM) circuitry 704, and example delta-sigma modulator (DSM) input generation circuitry 706. Also, the PFD circuitry 202 is example first PFD circuitry 202. In the example of FIG. 7, the quantization feedback circuitry 216 includes example quantization extraction circuitry 708, example switching circuitry 710, and example second phase frequency detector (PFD) circuitry 712.

In the illustrated example of FIG. 7, the MMFD circuitry 702 generates an MMFD output signal responsive to a DSM output signal and the VCO output signal. In the example of FIG. 7, the MMFD circuitry 702 is implemented by at least two analog frequency dividers, at least two digital frequency dividers, or at least one analog frequency divider and at least one digital frequency divider. Also, a first input terminal of the MMFD circuitry 702 is coupled to the output terminal of the VCO circuitry 210. In the example of FIG. 7, a second input terminal of the MMFD circuitry 702 is coupled to an output terminal of the DSM circuitry 704. Also, an output terminal of the MMFD circuitry 702 is coupled to a first input terminal of the DSM circuitry 704, a second input terminal of the quantization extraction circuitry 708, and the input terminal of the frequency divider circuitry 214.

In the illustrated example of FIG. 7, the MMFD circuitry 702 switches between multiple moduli to divide the frequency of the VCO output signal. For example, the MMFD circuitry 702 switches between m and m+1 to divide the frequency of the VCO output signal.

In the example of FIG. 7, m is set to the largest integer value that is less than or equal to k/N (e.g., m=floor(k/N)). For example, N is the modulus of the frequency divider circuitry 214. In the example of FIG. 7, N is six and k is 18.3. As such, m is 3 and the MMFD circuitry 702 switches between 3 and 4 as the modulus to divide the frequency of the VCO output signal. In the example of FIG. 7, when MMFD circuitry 702 divides the frequency of the VCO output signal by m, one cycle of the MMFD output signal includes m cycles of the VCO output signal. Also, when MMFD circuitry 702 divides the frequency of the VCO output signal by m+1, one cycle of the MMFD output signal includes m+1 cycles of the VCO output signal.

In the illustrated example of FIG. 7, the DSM circuitry 704 generates a DSM output signal responsive to the MMFD output signal and a DSM reference signal. In the example of FIG. 7, the DSM circuitry 704 is implemented by combinational logic circuitry, sequential logic circuitry, or combinational logic circuitry and sequential logic circuitry. Also, the first input terminal of the DSM circuitry 704 is coupled to the output terminal of the MMFD circuitry 702. In the example of FIG. 7, a second input terminal of the DSM circuitry 704 is coupled to an output terminal of the DSM input generation circuitry 706. Also, the output terminal of the DSM circuitry 704 is coupled to the second input terminal of the MMFD circuitry 702.

In the illustrated example of FIG. 7, the DSM circuitry 704 is a first order DSM. For example, the overclocking factor of the DSM circuitry 704 corresponds to the order of the DSM circuitry 704. In the example of FIG. 7, the DSM circuitry 704 controls which modulus the MMFD circuitry 702 utilizes to divide the frequency of the VCO output signal. For example, the DSM circuitry 704 samples the MMFD output signal responsive to a DSM reference signal generated by the DSM input generation circuitry 706. In the example of FIG. 7, the DSM circuitry 704 is clocked at the frequency of the MMFD output signal. For example, the frequency of the MMFD output signal is N times the frequency of the feedback signal (e.g., $F_{MMFD}$=6*500 MHz=3 GHz) to suppress quantization noise. In the example of FIG. 7, the DSM circuitry 704 generates an oversampled representation of the MMFD output signal to generate the DSM output signal as a bitstream.

In the illustrated example of FIG. 7, the DSM input generation circuitry 706 generates the DSM reference signal. In the example of FIG. 7, the DSM input generation circuitry 706 is implemented by combinational logic circuitry, sequential logic circuitry, or combinational logic circuitry and sequential logic circuitry. Also, the output terminal of the DSM input generation circuitry 706 is coupled to the second input terminal of the DSM circuitry 704. In the example of FIG. 7, the DSM input generation circuitry 706 generates the DSM reference signal as a fractional word. For example, the fractional word is set to the difference between k/N and the largest integer value that is less than or equal to k/N. As such, the fractional word is set to 0.05 (e.g., $DSM_{IN}$=(18.3/6)−floor(18.3/6)=3.05−3=0.05).

In the illustrated example of FIG. 7, the quantization extraction circuitry 708 samples the MMFD output signal to generate a first delayed MMFD output signal and a second delayed MMFD output signal including quantization information present in the MMFD output signal. In the example of FIG. 7, the quantization extraction circuitry 708 is implemented by delay circuitry as described further herein. Also, a first input terminal of the quantization extraction circuitry 708 is coupled to the output terminal of the VCO circuitry 210. In the example of FIG. 7, the second input terminal of the quantization extraction circuitry 708 is coupled to the output terminal of the MMFD circuitry 702. In the example of FIG. 7, a first output terminal and a second output terminal of the quantization extraction circuitry 708 are coupled to a first input terminal and a second input terminal of the switching circuitry 710, respectively.

In the illustrated example of FIG. 7, the quantization extraction circuitry 708 preserves noise shaping present at the output terminal of the MMFD circuitry 702. For example, rising edges of the MMD output signal include quantization information as determined by the DSM output signal. However, some of the rising edges of MMD output signal are removed after the frequency divider circuitry 214 divides the frequency of the MMFD output signal. Accordingly, the quantization extraction circuitry 708 preserves (e.g., extracts) quantization information before the quantization information is removed (e.g., lost) by the frequency divider circuitry 214 dividing the frequency of the MMFD output signal. The quantization extraction circuitry 708 adds the quantization information as feedback for the clock generation circuitry 116 by providing the quantization information to the PFD circuitry 712 via the switching circuitry 710.

In the illustrated example of FIG. 7, the switching circuitry 710 couples, decouples, or couples and decouples the quantization extraction circuitry 708 to the PFD circuitry 712 based on the masking signal generated by the masking logic circuitry 218. In the example of FIG. 7, the switching circuitry 710 is implemented by one or more switches (e.g., transistors, diodes, etc.) and combinational logic circuitry, sequential logic circuitry, or combinational logic circuitry and sequential logic circuitry as described further herein. Also, the first input terminal and the second input terminal of the switching circuitry 710 are coupled to the first output terminal and the second output terminal of the quantization extraction circuitry 708, respectively. In the example of FIG. 7, a third input terminal of the switching circuitry 710 is coupled to the output terminal of the masking logic circuitry 218. Also, a first output terminal and a second output terminal of the switching circuitry 710 are coupled to a first input terminal and a second input terminal of the PFD circuitry 712, respectively. In the example of FIG. 7, the switching circuitry 710 is coupled to an example ground terminal 714.

In the illustrated example of FIG. 7, the PFD circuitry 712 compares a first signal at the first input terminal to a second signal at the second input terminal. In the example of FIG. 7, the PFD circuitry 712 is implemented by combinational logic circuitry, sequential logic circuitry, or combinational logic circuitry and sequential logic circuitry. Also, the first input terminal and the second input terminal of the PFD circuitry 712 are coupled to the first output terminal and the second output terminal of the switching circuitry 710, respectively. In the example of FIG. 7, a first output terminal and a second output terminal of the PFD circuitry 712 are coupled to the third input terminal and the fourth input terminal of the adder circuitry 204, respectively.

In the illustrated example of FIG. 7, when the first input terminal and the second input terminal of the PFD circuitry 712 are coupled to the first output terminal and the second output terminal of the quantization extraction circuitry 708, respectively, the PFD circuitry 712 compares rising edges of MMFD output signal with rising edges of MMFD output signal shifted by the mean of m and m+1 VCO clock cycles (e.g., m+0.5 VCO clock cycles). For example, the PFD circuitry 712 determines which of the first signal at the first input terminal and the second signal at the second input terminal has a zero-crossing earlier or more often. In the example of FIG. 7, when the PFD circuitry 712 detects that the first signal has a zero-crossing before the second signal, the PFD circuitry 712 generates a signal having a positive voltage at the first output terminal. Also, when the PFD circuitry 712 detects that the second signal has a zero-crossing before the first clock signal, the PFD circuitry 712 generates a signal having a negative voltage at the second output terminal. In some example, the PFD circuitry 712 operates differently.

Figure 8:
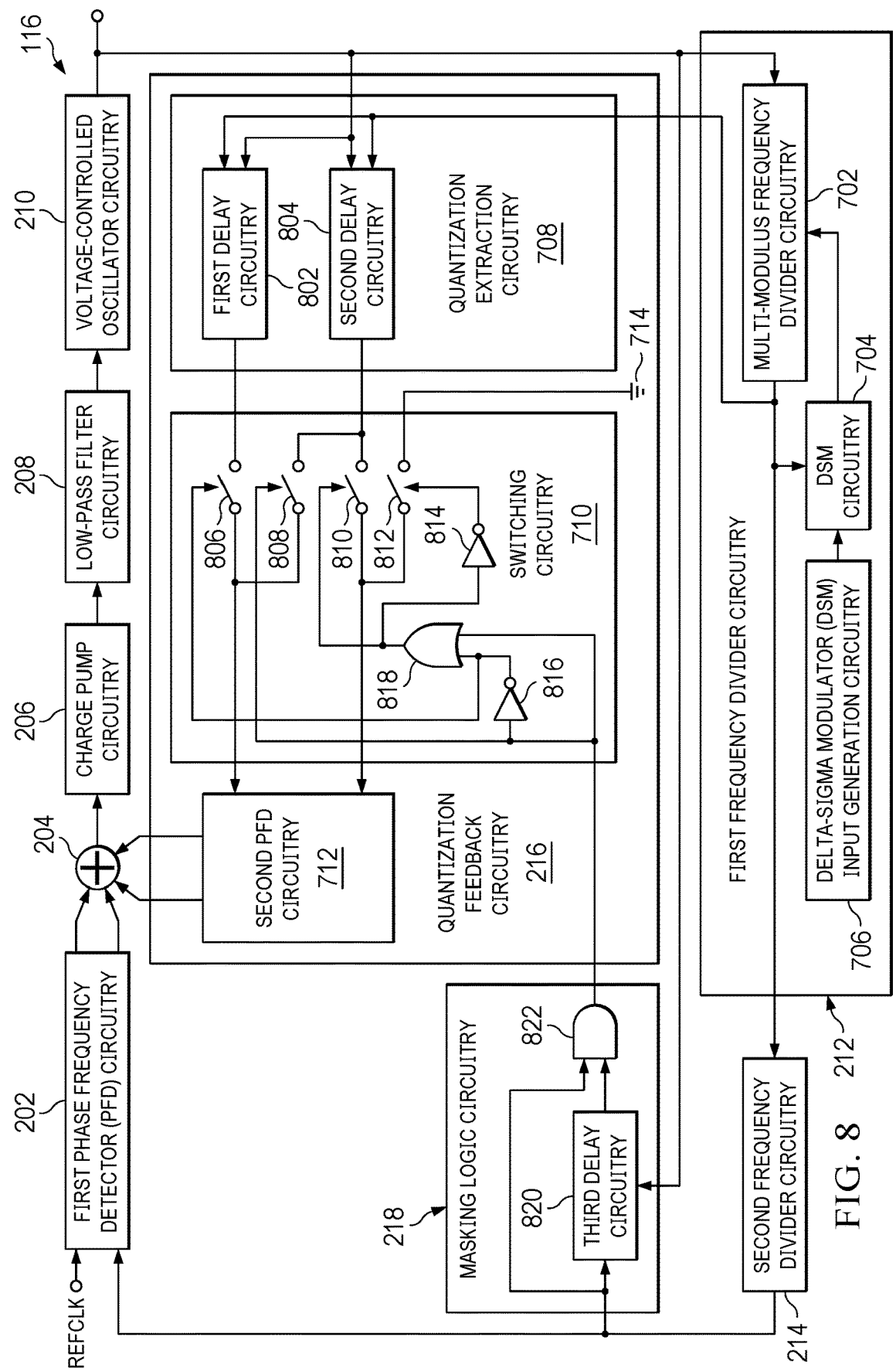
FIG. 8 is a block diagram of the clock generation circuitry of FIG. 7 including an example implementation of the quantization extraction circuitry, the switching circuitry, and the masking logic circuitry of FIG. 7.

FIG. 8 is a block diagram of the clock generation circuitry 116 of FIG. 7 including an example implementation of the quantization extraction circuitry 708, the switching circuitry 710, and the masking logic circuitry 218 of FIG. 7. In the example of FIG. 8, the quantization extraction circuitry 708 includes example first delay circuitry 802 and example second delay circuitry 804. Also, the switching circuitry 710 includes an example first switch 806, an example second switch 808, an example third switch 810, an example fourth switch 812, an example first NOT gate 814, an example second NOT gate 816, and an example OR gate 818. In the example of FIG. 8, the masking logic circuitry 218 includes example third delay circuitry 820 and an example AND gate 822.

In the illustrated example of FIG. 8, the delay circuitry 802 delays the MMFD output signal by 0.5 clock cycles of the VCO output signal. In the example of FIG. 8, the delay circuitry 802 is implemented by a D flipflop clocked by falling edges of the VCO output signal. Also, a first input terminal of the delay circuitry 802 is coupled to the output terminal of the VCO circuitry 210. In the example of FIG. 8, a second input terminal of the delay circuitry 802 is coupled to the output terminal of the MMFD circuitry 702. In the example of FIG. 8, an output terminal of the delay circuitry 802 is coupled to a first terminal of the switch 806.

In the illustrated example of FIG. 8, the delay circuitry 804 delays the MMFD output signal by m+1 clock cycles of the VCO output signal. For example, the delay circuitry 804 delays the MMFD output signal by 4 VCO clock cycles. In the example of FIG. 8, the delay circuitry 804 is implemented by a D flipflop clocked by falling edges of the VCO output signal. Also, a first input terminal of the delay circuitry 804 is coupled to the output terminal of the VCO circuitry 210. In the example of FIG. 8, a second input terminal of the delay circuitry 804 is coupled to the output terminal of the MMFD circuitry 702. In the example of FIG. 8, an output terminal of the delay circuitry 804 is coupled to a first terminal of the switch 810.

In the illustrated example of FIG. 8, the switch 806 is implemented by a transistor. In the example of FIG. 8, the first terminal of the switch 806 is coupled to the output terminal of the delay circuitry 802. Also, a second terminal of the switch 806 is coupled to the first input terminal of the PFD circuitry 712. In the example of FIG. 8, a control terminal of the switch 806 is coupled to an output terminal of the NOT gate 816.

In the illustrated example of FIG. 8, the switch 808 is implemented by a transistor. In the example of FIG. 8, a first terminal of the switch 808 is coupled to the output terminal of the delay circuitry 804. Also, a second terminal of the switch 808 is coupled to the first input terminal of the PFD circuitry 712. In the example of FIG. 8, a control terminal of the switch 808 is coupled to an output terminal of the AND gate 822.

In the illustrated example of FIG. 8, the switch 810 is implemented by a transistor. In the example of FIG. 8, the first terminal of the switch 810 is coupled to the output terminal of the delay circuitry 804. Also, a second terminal of the switch 810 is coupled to the second input terminal of the PFD circuitry 712. In the example of FIG. 8, a control terminal of the switch 810 is coupled to an output terminal of the OR gate 818.

In the illustrated example of FIG. 8, the switch 812 is implemented by a transistor. In the example of FIG. 8, a first terminal of the switch 812 is coupled to the ground terminal 714. Also, a second terminal of the switch 812 is coupled to the second input terminal of the PFD circuitry 712. In the example of FIG. 8, a control terminal of the switch 812 is coupled to an output terminal of the NOT gate 814.

In the illustrated example of FIG. 8, the NOT gate 814 is implemented by one or more transistors. In the example of FIG. 8, an input terminal of the NOT gate 814 is coupled to the output terminal of the OR gate 818. Also, the output terminal of the NOT gate 814 is coupled to the control terminal of the switch 812. In the example of FIG. 8, the NOT gate 816 is implemented by one or more transistors. In the example of FIG. 8, an input terminal of the NOT gate 816 is coupled to the output terminal of the AND gate 822. Also, the output terminal of the NOT gate 816 is coupled to a first input terminal of the OR gate 818 and the control terminal of the switch 806.

In the illustrated example of FIG. 8, the OR gate 818 is implemented by one or more transistors. In the example of FIG. 8, the first input terminal of the OR gate 818 is coupled to the output terminal of the NOT gate 816. Also, a second input terminal of the OR gate 818 is coupled to the output terminal of the AND gate 822. In the example of FIG. 8, the output terminal of the OR gate 818 is coupled to the control terminal of the switch 810 and the input terminal of the NOT gate 814.

In the illustrated example of FIG. 8, the delay circuitry 820 delays the feedback signal by 1 clock cycles of the VCO output signal. In the example of FIG. 8, the delay circuitry 820 is implemented by a D flipflop clocked by rising edges of the VCO output signal. Also, a first input terminal of the delay circuitry 820 is coupled to the output terminal of the VCO circuitry 210. In the example of FIG. 8, a second input terminal of the delay circuitry 820 is coupled to the output terminal of the frequency divider circuitry 214. Also, an output terminal of the delay circuitry 820 is coupled to a second input terminal of the AND gate 822.

In the illustrated example of FIG. 8, the AND gate 822 is implemented by one or more transistors. In the example of FIG. 8, a first input terminal of the AND gate 822 is coupled to the output terminal of the frequency divider circuitry 214. Also, the second input terminal of the AND gate 822 is coupled to the output terminal of the delay circuitry 820. In the example of FIG. 8, the output terminal of the AND gate 822 is coupled to the control terminal of the switch 808, the input terminal of the NOT gate 816, and the second input terminal of the OR gate 818.

In the illustrated example of FIG. 8, the masking logic circuitry 218 generates the masking signal based on rising edges of the feedback signal generated by the frequency divider circuitry 214. For example, for every rising edge of the feedback signal, the AND gate 822 generates a masking signal pulse (e.g., a logic high value (e.g., 5V) on the masking signal) that is 1 VCO clock cycle wide. In such examples, the NOT gate 816 generates a logic low value for 1 VCO clock cycle, the OR gate 818 generates a logic high value for 1 VCO clock cycle, and the NOT gate 814 generates a logic low value for 1 VCO clock cycle. As such, when the AND gate 822 generates a masking signal pulse that is 1 VCO clock cycle wide, the switch 806 is open for 1 VCO clock cycle, the switch 808 is closed for 1 VCO clock cycle, the switch 810 is closed for 1 VCO clock cycle, and the switch 812 is open for 1 VCO clock cycle.

Thus, when the AND gate 822 generates a masking signal pulse that is 1 VCO clock cycle wide, the switching circuitry 710 couples the first input terminal and the second input terminal of the PFD circuitry 712 to the output terminal of the delay circuitry 804. Accordingly, the PFD circuitry 712 detects the same signal at the first input terminal and the second input terminal. As such, the PFD circuitry 712 does not detect a phase difference and does not output a positive or negative voltage.

In the illustrated example of FIG. 8, when the output of the AND gate 822 is a logic low value (e.g., 0V), the NOT gate 816 generates a logic high value, the OR gate 818 generates a logic high value, and the NOT gate 814 generates a logic low value. As such, when the AND gate 822 generates a logic low value, the switch 806 is closed, the switch 808 is open, the switch 810 is closed, and the switch 812 is open. Thus, when the AND gate 822 generates a logic low value, the switching circuitry 710 couples the first input terminal of the PFD circuitry 712 to the output terminal of the delay circuitry 802. Also, when the AND gate 822 generates a logic low value, the switching circuitry 710 couples the second input terminal of the PFD circuitry 712 to the output terminal of the delay circuitry 804.

In the illustrated example of FIG. 8, since one cycle of the MMFD output signal includes either m or m+1 cycles of the VCO output signal (e.g., the VCO clock signal), the PFD circuitry 712 can determine the MMFD modulus by comparing a rising edge of the MMFD output signal to a previous rising edge of the MMFD output signal shifted by the mean of m and m+1 VCO clock cycles (e.g., m+0.5 VCO clock cycles). In the example of FIG. 8, by comparing the MMFD output signal shifted by 0.5 VCO clock cycles to the MMFD output signal shifted by m+1 VCO clock cycles, the PFD circuitry 712 preserves the m+0.5 VCO clock cycles shift between the two input terminals. In the example of FIG. 8, when one cycle of the MMFD output signal includes m cycles of the VCO output signal, the PFD circuitry 712 generates a positive voltage that is 0.5 VCO clock cycles wide. Also, when one cycle of the MMFD output signal includes m+1 cycles of the VCO output signal, the PFD circuitry 712 generates a negative voltage that is 0.5 VCO clock cycles wide. In examples described herein, the shift by m+0.5 VCO clock cycles is independent of the fractional divider value of the MMFD circuitry 702.

While example manners of implementing the frequency divider circuitry 212, the quantization feedback circuitry 216, and the masking logic circuitry 218 of FIG. 2 are illustrated in FIGS. 7 and 8, one or more of the elements, processes, or devices illustrated in FIGS. 7 and 8 may be at least one of combined, divided, re-arranged, omitted, eliminated, or implemented in any other way. Further, the example MMFD circuitry 702, the example DSM circuitry 704, the example DSM input generation circuitry 706, or, more generally, the example frequency divider circuitry 212 of FIGS. 7 and 8, or the example delay circuitry 802, the example delay circuitry 804, or, more generally, the example quantization extraction circuitry 708 of FIG. 8, or the example switch 806, the example switch 808, the example switch 810, the example switch 812, the example NOT gate 814, the example NOT gate 816, the example OR gate 818, or, more generally, the example switching circuitry 710 of FIG. 8, the example PFD circuitry 712, or, more generally, the quantization feedback circuitry 216 of FIGS. 7 and 8, or the example delay circuitry 820, the example AND gate 822, or, more generally, the example masking logic circuitry 218 of FIG. 8, may be implemented by hardware alone or by hardware in combination with at least one of software or firmware.

Thus, for example, any of the example MMFD circuitry 702, the example DSM circuitry 704, the example DSM input generation circuitry 706, or, more generally, the example frequency divider circuitry 212 of FIGS. 7 and 8, or the example delay circuitry 802, the example delay circuitry 804, or, more generally, the example quantization extraction circuitry 708 of FIG. 8, or the example switch 806, the example switch 808, the example switch 810, the example switch 812, the example NOT gate 814, the example NOT gate 816, the example OR gate 818, or, more generally, the example switching circuitry 710 of FIG. 8, the example PFD circuitry 712, or, more generally, the quantization feedback circuitry 216 of FIGS. 7 and 8, or the example delay circuitry 820, the example AND gate 822, or, more generally, the example masking logic circuitry 218 of FIG. 8, could be implemented by at least one of programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs.

Further still, the example frequency divider circuitry 212 of FIGS. 7 and 8, the example quantization extraction circuitry 708 of FIGS. 7 and 8, the example switching circuitry 710 of FIGS. 7 and 8, the example PFD circuitry 712 of FIGS. 7 and 8, or, more generally, the example quantization feedback circuitry 216 of FIGS. 7 and 8, or the example masking logic circuitry 218 of FIG. 8 may include one or more elements, processes, or devices in addition to, or instead of, those illustrated in FIGS. 7 and 8, and may include more than one of any or all of the illustrated elements, processes, and devices.

Figure 9:
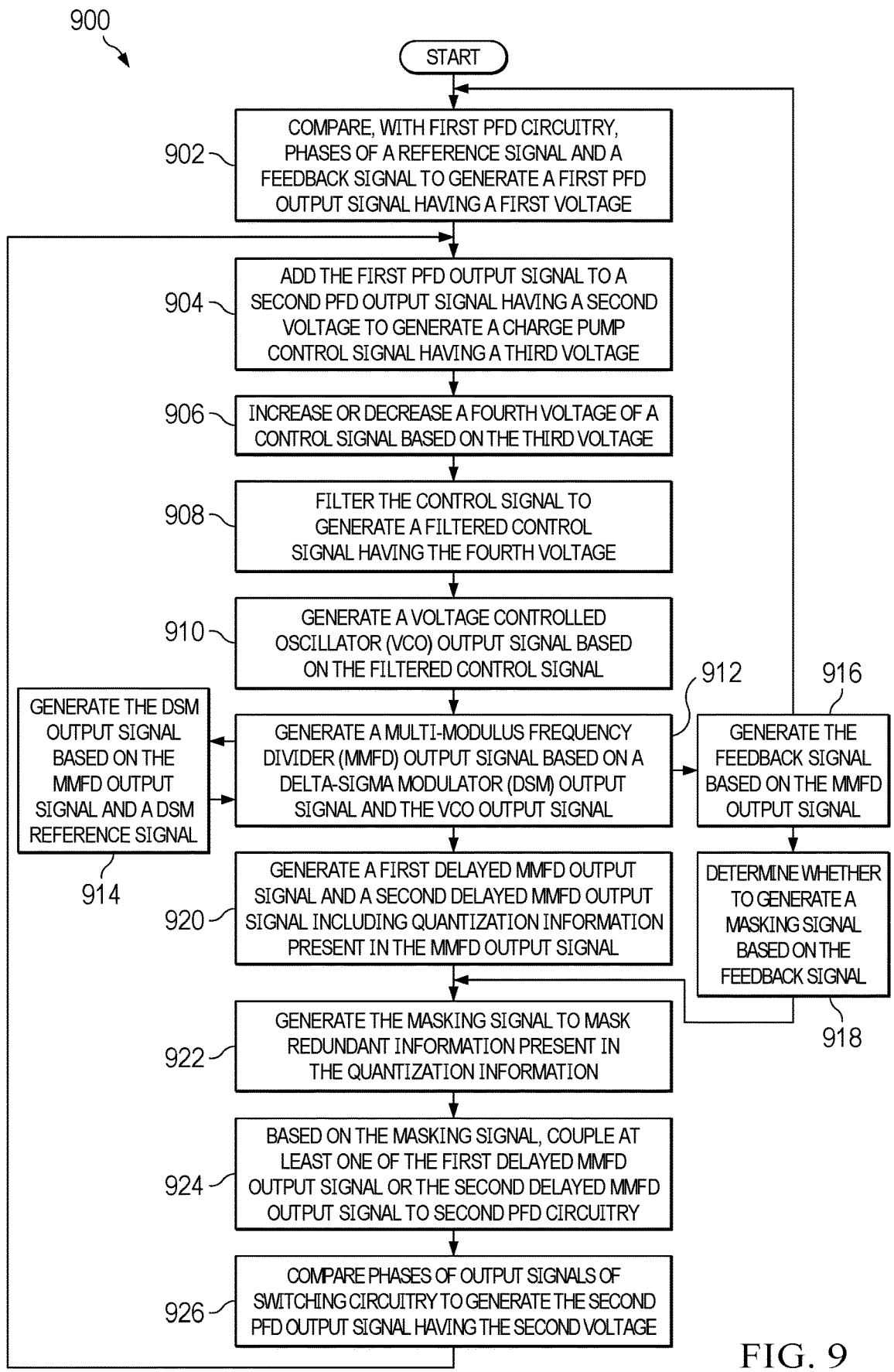
FIG. 9 is a flowchart representative of example machine-readable instructions or example operations that may be executed, instantiated, or performed using an example programmable circuitry implementation of the clock generation circuitry of FIG. 7.

FIG. 9 is a flowchart representative of example machine-readable instructions or example operations 900 that may be executed, instantiated, or performed using an example programmable circuitry implementation of the clock generation circuitry 116 of FIG. 7. The example machine-readable instructions or the example operations 900 of FIG. 9 begin at block 902, at which the PFD circuitry 202 compares phases of a reference signal and a feedback signal to generate a first PFD output signal having a first voltage. At block 904, the adder circuitry 204 adds the first PFD output signal to a second PFD output signal having a second voltage to generate a charge pump control signal having a third voltage.

In the illustrated example of FIG. 9, at block 906, the charge pump circuitry 206 increases or decreases a fourth voltage of a control signal based on the third voltage of the charge pump control signal. At block 908, the low-pass filter circuitry 208 filters the control signal to generate a filtered control signal having the fourth voltage. In the example of FIG. 9, the VCO circuitry 210 generates a VCO output signal based on the filtered control signal at block 910. At block 912, the MMFD circuitry 702 generates an MMFD output signal based on a DSM output signal and the VCO output signal.

In the illustrated example of FIG. 9, at block 914, the DSM circuitry 704 generates the DSM output signal based on the MMFD output signal and a DSM reference signal. After block 914, the MMFD circuitry 702 generates the MMFD output signal based on the DSM output signal and the VCO output signal at block 912. In the example of FIG. 9, at block 916, the frequency divider circuitry 214 generates the feedback signal based on the MMFD output signal. After block 916, the PFD circuitry 202 compares phases of the reference signal and the feedback signal at block 902 to generate a first PFD output signal having a first voltage. Also, after block 916, the masking logic circuitry 218 determines whether to generate a masking signal based on the feedback signal at block 918.

In the illustrated example of FIG. 9, at block 920, the quantization extraction circuitry 708 generates a first delayed MMFD output signal and a second delayed MMFD output signal including quantization information present in the MMFD output signal. At block 922, the masking logic circuitry 218 generates the masking logic signal to mask redundant information present in the quantization information. For example, redundant information is indicative of rising edges present in the MMFD output signal and the feedback signal.

In the illustrated example of FIG. 9, at block 924, based on the masking signal, the switching circuitry 710 couples at least one of the first delayed MMFD output signal or the second delayed MMFD output signal to the PFD circuitry 712. At block 926, the PFD circuitry 712 compares phases of output signals of the switching circuitry 710 to generate the second PFD output signal having the second voltage. After block 926, the adder circuitry 204 adds the first PFD output signal to the second PFD output signal having the second voltage to generate the charge pump control signal having the third voltage.

Figure 10:
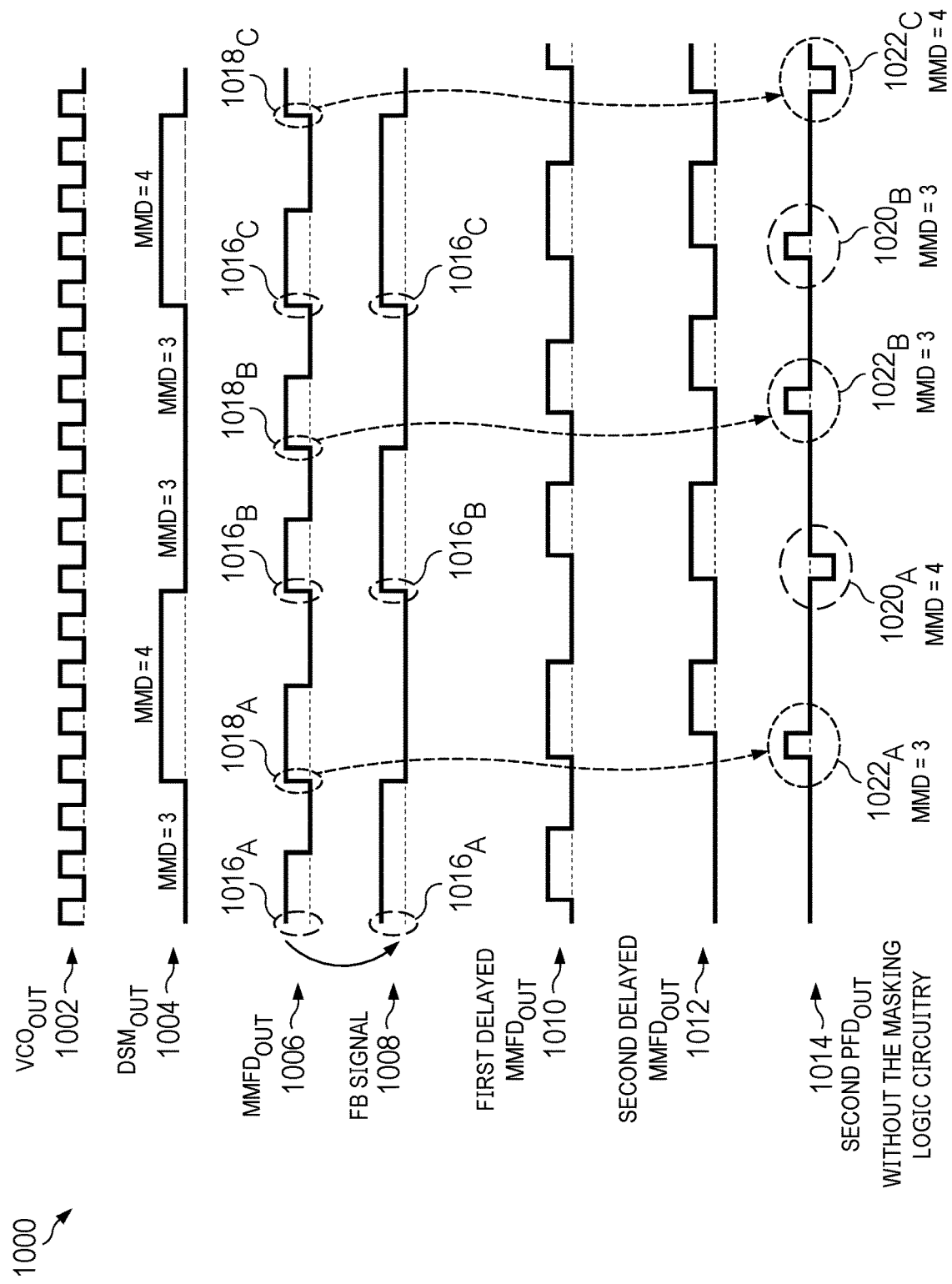
FIG. 10 is a graphical illustration depicting example operation of the clock generation circuitry of FIG. 7.

FIG. 10 is a graphical illustration 1000 depicting example operation of the clock generation circuitry 116 of FIG. 7. The graphical illustration 1000 of FIG. 10 includes an example first plot 1002, an example second plot 1004, an example third plot 1006, an example fourth plot 1008, an example fifth plot 1010, an example sixth plot 1012, and an example seventh plot 1014. In the example of FIG. 10, the plot 1002 illustrates the VCO output signal ($VCO_{OUT}$). Also, the plot 1004 illustrates the DSM output signal ($DSM_{OUT}$). In the example of FIG. 10, the plot 1006 illustrates the MMFD output signal ($MMFD_{OUT}$). For example, one cycle of the MMFD output signal includes three cycles of the VCO output signal or four cycles of the VCO output signal depending on the value of the DSM output signal of the plot 1004.

In the illustrated example of FIG. 10, the plot 1008 illustrates the feedback signal (FB signal). Also, the plot 1010 illustrates the first delayed MMFD output signal (first delayed MMFD$_{OUT}$). For example, the first delayed MMFD output signal represents the MMFD output signal delayed by 0.5 cycles of the VCO output signal. In the example of FIG. 10, the plot 1012 illustrates the second delayed MMFD output signal (second delayed MMFD$_{OUT}$). For example, the second delayed MMFD output signal represents the MMFD output signal delayed by 4 cycles of the VCO output signal. In the example of FIG. 10, the plot 1014 illustrates the second PFD output signal (second PFD$_{OUT}$) without the masking logic circuitry 218.

In the illustrated example of FIG. 10, an example first edge 1016$_A$, an example second edge 1016$_B$, and an example third edge 1016$_C$ are preserved in the feedback signal of the plot 1008. Also, an example fourth edge 1018$_A$, an example fifth edge 1018$_B$, and an example sixth edge 1018$_C$ are not present in the feedback signal of the plot 1008. As such, the masking logic circuitry 218 masks an example first pulse 1020$_A$ and an example second pulse 1020$_B$ of the second PFD output signal corresponding to the edge 1016$_B$ and the edge 1016$_C$, respectively. For example, the masking logic circuitry 218 can generate the masking signal pulse before or after a rising edge of the feedback signal. Also, the masking logic circuitry 218 does not mask an example third pulse 1022$_A$, an example fourth pulse 1022$_B$, or an example fifth pulse 1022$_C$ corresponding to the edge 1018$_A$, the edge 1018$_B$, and the edge 1018$_C$, respectively.

In the illustrated example of FIG. 10, the PFD circuitry 712 compares the MMFD output signal shifted by 0.5 cycles of the VCO output signal to the MMFD output signal shifted by 4 cycles of the VCO output signal to extract the sequence of the DSM output signal. For example, the PFD circuitry 712 represents the MMFD circuitry 702 modulus of three as a positive voltage pulse that is 0.5 cycles of the VCO output signal wide. Also, the PFD circuitry 712 represents the MMFD circuitry 702 modulus of four as a negative voltage pulse that is 0.5 cycles of the VCO output signal wide.

In the illustrated example of FIG. 10, apart from edge information present in rising edges of the feedback signal of the plot 1008, information on other edges is removed by the frequency divider circuitry 214. As such, the quantization extraction circuitry 708 extracts quantization information present in the MMFD output signal. Also, the masking logic circuitry 218 masks redundant information (e.g., rising edges) already present in the feedback signal. For example, the masking logic circuitry 218 generates a masking signal pulse to mask the second PFD output signal pulse that includes information present in the feedback signal.

Figure 11:
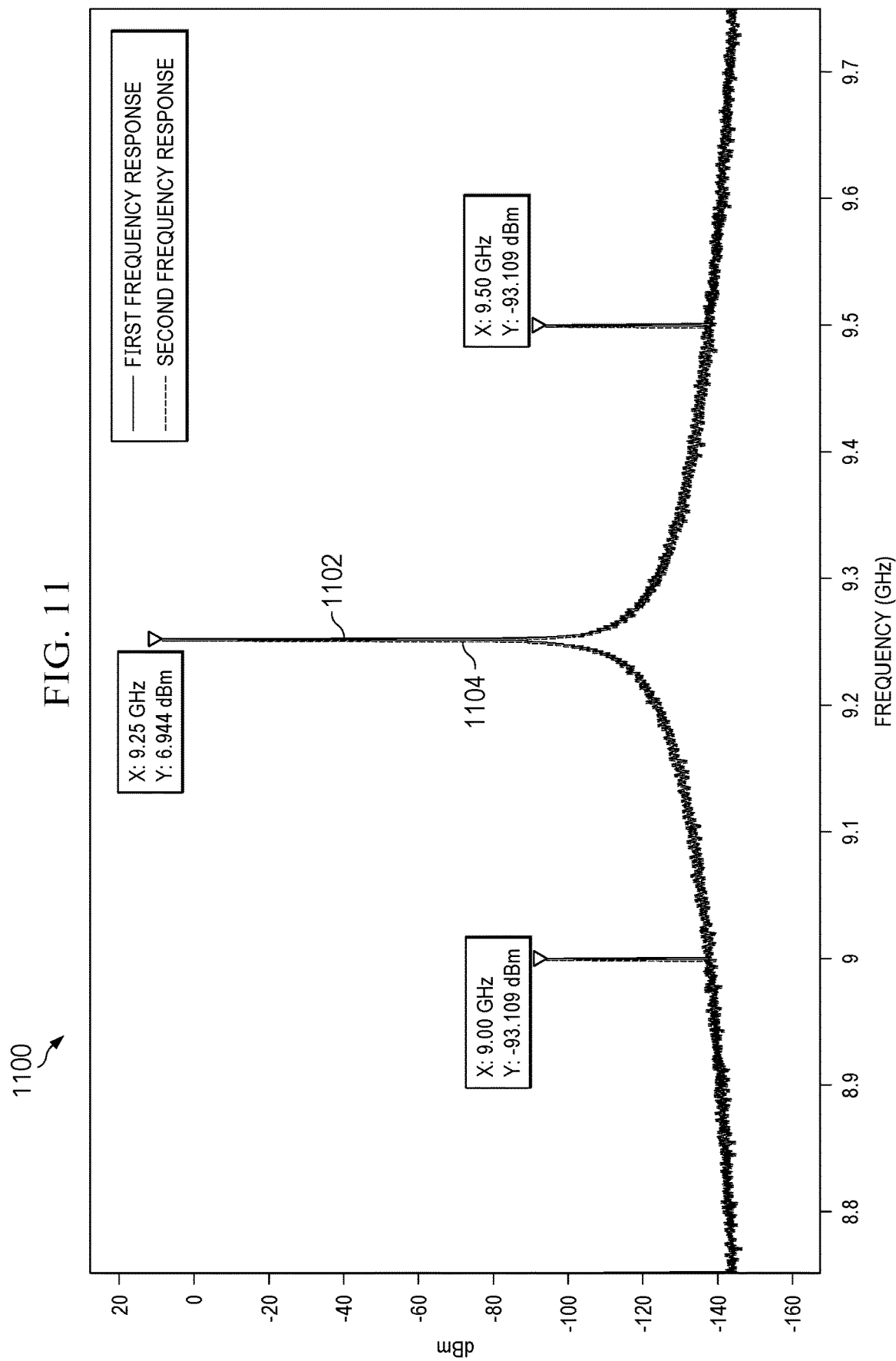
FIG. 11 is a graphical illustration depicting an example first frequency response of the clock generation circuitry of FIG. 7 with PFD circuitry that is matched and an example second frequency response of the clock generation circuitry of FIG. 7 with PFD circuitry that is mismatched by a first delay.

FIG. 11 is a graphical illustration 1100 depicting an example first frequency response 1102 of the clock generation circuitry 116 of FIG. 7 with PFD circuitry that is matched and an example second frequency response 1104 of the clock generation circuitry 116 of FIG. 7 with PFD circuitry that is mismatched by a first delay. In the example of FIG. 11, the frequency response 1102 depicts the frequency response of the clock generation circuitry 116 when there is no (or negligible) delay mismatch between (1) the transmission paths between the output terminals of the PFD circuitry 202 and the input terminals of the adder circuitry 204 and (2) the transmission paths between the output terminals of the PFD circuitry 712 and the input terminals of the adder circuitry 204. For example, the delay mismatch is 0.5 cycles of the VCO output signal.

In the illustrated example of FIG. 11, there are no (or negligible) differences between the frequency response 1102 and the frequency response 1104. As such, performance of the clock generation circuitry 116 is not impacted even if there is a mismatch in the transmission paths of the PFD circuitry 202 and the PFD circuitry 712. Thus, implementation of the clock generation circuitry 116 in a semiconductor die is easier than other techniques because the clock generation circuitry 116 is resilient to delay mismatches between circuitry that can result from imperfections in the semiconductor die.

Figure 12:
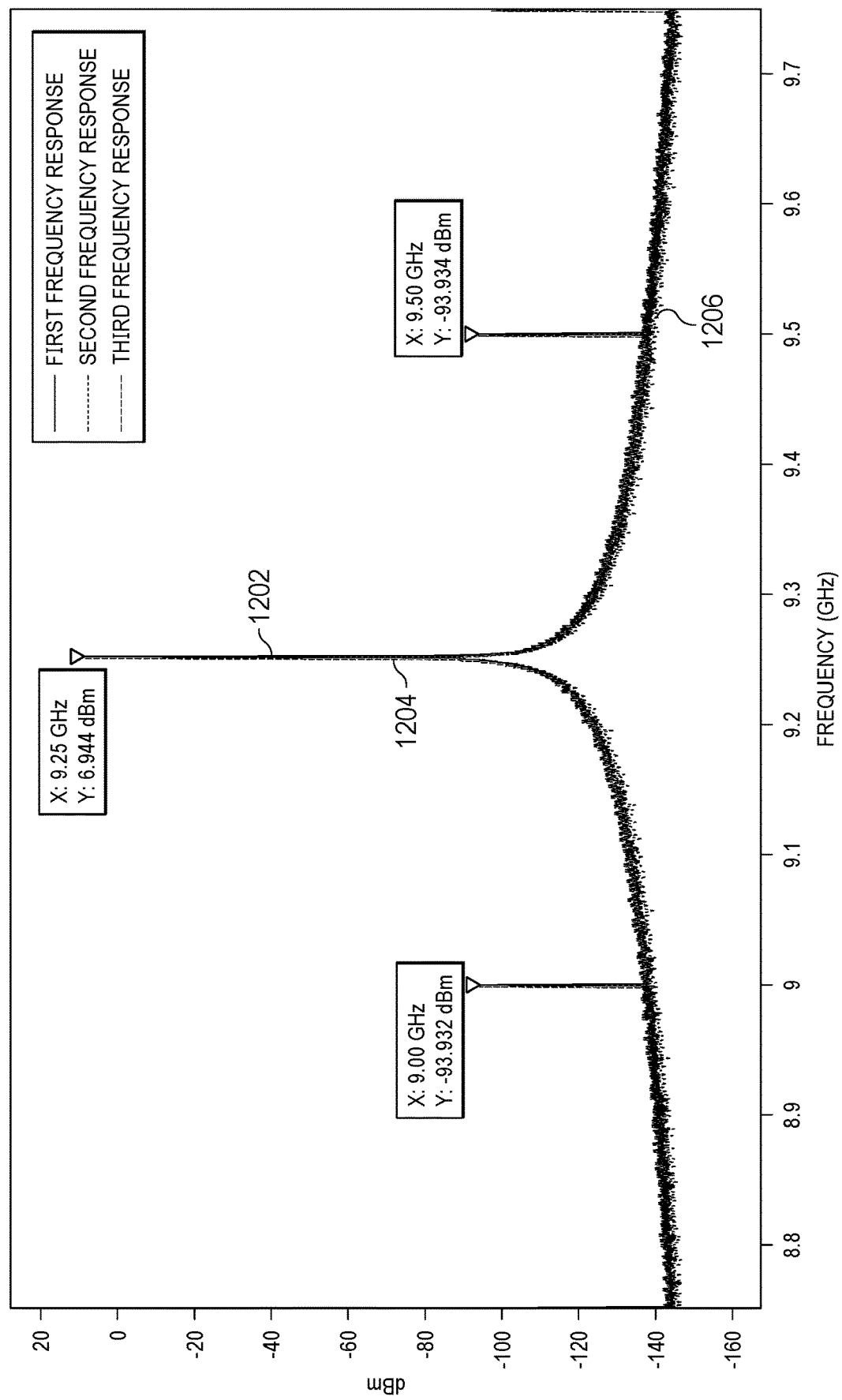
FIG. 12 is a graphical illustration depicting an example first frequency response of the clock generation circuitry of FIG. 7 with PFD circuitry that is matched, an example second frequency response of the clock generation circuitry of FIG. 7 with PFD circuitry that is mismatched by a first delay, and an example third frequency response of the clock generation circuitry of FIG. 7 with PFD circuitry that is mismatched by a second delay.

FIG. 12 is a graphical illustration 1200 depicting an example first frequency response 1202 of the clock generation circuitry 116 of FIG. 7 with PFD circuitry that is matched, an example second frequency response 1204 of the clock generation circuitry 116 of FIG. 7 with PFD circuitry that is mismatched by a first delay, and an example third frequency response 1206 of the clock generation circuitry 116 of FIG. 7 with PFD circuitry that is mismatched by a second delay. In the example of FIG. 12, the frequency response 1202 depicts the frequency response of the clock generation circuitry 116 when there is no (or negligible) delay mismatch between (1) the transmission paths between the output terminals of the PFD circuitry 202 and the input terminals of the adder circuitry 204 and (2) the transmission paths between the output terminals of the PFD circuitry 712 and the input terminals of the adder circuitry 204. Also, the frequency response 1204 depicts the frequency response of the clock generation circuitry 116 when there is a first delay mismatch between (1) the transmission paths between the output terminals of the PFD circuitry 202 and the input terminals of the adder circuitry 204 and (2) the transmission paths between the output terminals of the PFD circuitry 712 and the input terminals of the adder circuitry 204. For example, the first delay mismatch is 0.5 cycles of the VCO output signal.

In the illustrated example of FIG. 12, the frequency response 1206 depicts the frequency response of the clock generation circuitry 116 when there is a first delay mismatch and a second delay mismatch in the clock generation circuitry 116. In the example of FIG. 8, the first delay mismatch is a delay mismatch between (1) the transmission paths between the output terminals of the PFD circuitry 202 and the input terminals of the adder circuitry 204 and (2) the transmission paths between the output terminals of the PFD circuitry 712 and the input terminals of the adder circuitry 204. For example, the first delay mismatch is a delay mismatch of 0.5 cycles of the VCO output signal. In the example of FIG. 8, the second delay mismatch is a delay mismatch between (1) the transmission path between the first output terminal of the switching circuitry 710 and the first input terminal of the PFD circuitry 712 and (2) the transmission path between the second output terminal of the switching circuitry 710 and the second input terminal of the PFD circuitry 712. In the example of FIG. 12, the second delay mismatch is of 0.5 cycles of the VCO output signal.

In the illustrated example of FIG. 12, there are no (or negligible) differences between the frequency response 1202, the frequency response 1204, and the frequency response 1206. As such, performance of the clock generation circuitry 116 is not impacted even if there is a mismatch in the transmission paths of the PFD circuitry 202 and the PFD circuitry 712. Thus, implementation of the clock generation circuitry 116 in a semiconductor die is easier than other techniques because the clock generation circuitry 116 is resilient to delay mismatches between circuitry that can result from imperfections in the semiconductor die.

Figure 13:
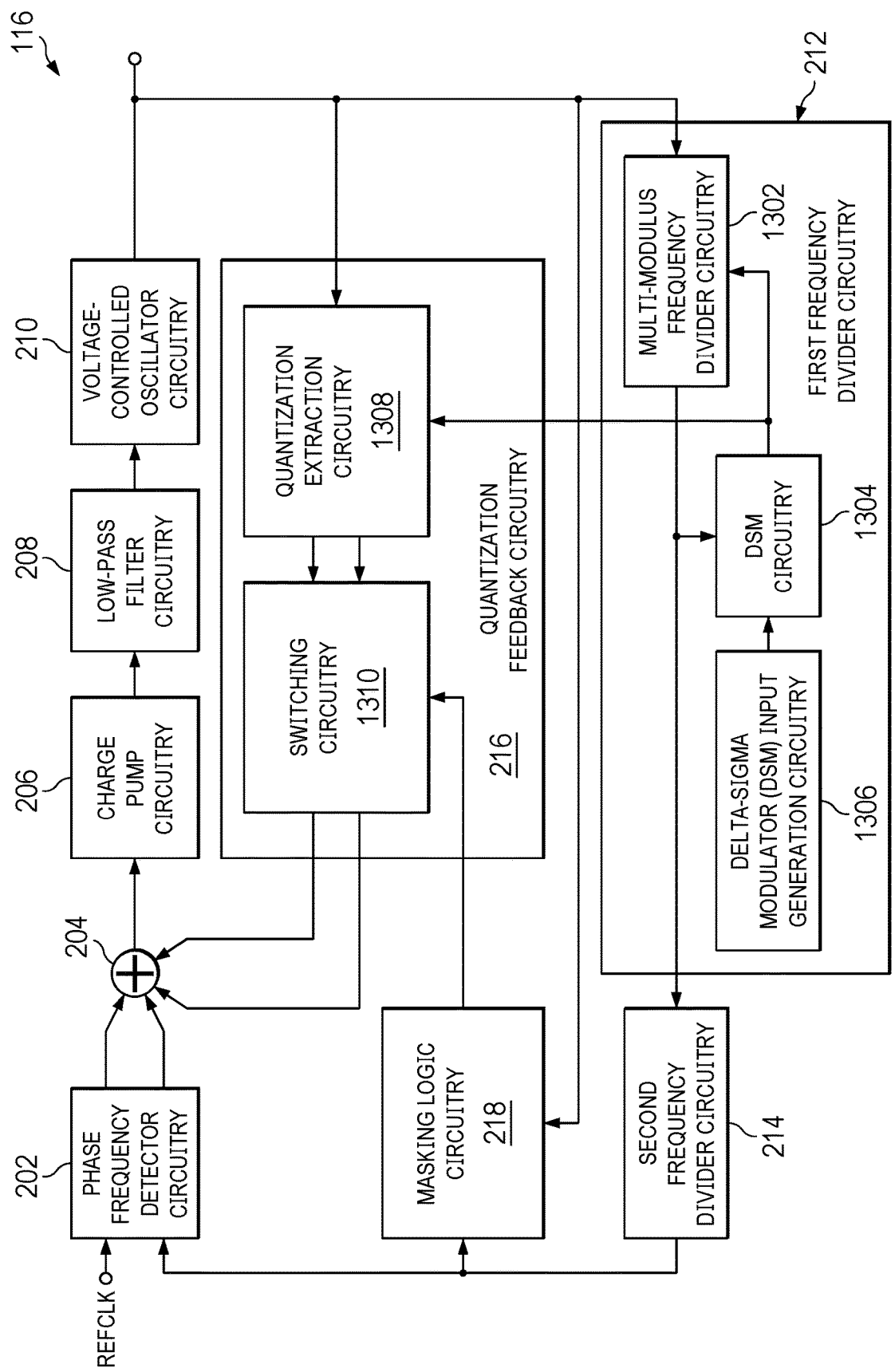
FIG. 13 is a block diagram of the clock generation circuitry of FIG. 2 including a second example implementation of the first frequency divider circuitry and the quantization feedback circuitry of FIG. 2.

FIG. 13 is a block diagram of the clock generation circuitry 116 of FIG. 2 including a second example implementation of the frequency divider circuitry 212 and the quantization feedback circuitry 216 of FIG. 2. In the example of FIG. 13, the frequency divider circuitry 212 includes example multi-modulus frequency divider (MMFD) circuitry 1302, example delta-sigma modulator (DSM) circuitry 1304, and example delta-sigma modulator (DSM) input generation circuitry 1306. In the example of FIG. 13, the quantization feedback circuitry 216 includes example quantization extraction circuitry 1308 and example switching circuitry 1310.

In the illustrated example of FIG. 13, the MMFD circuitry 1302 generates an MMFD output signal responsive to a DSM output signal and the VCO output signal. In the example of FIG. 13, the MMFD circuitry 1302 is implemented by at least two analog frequency dividers, at least two digital frequency dividers, or at least one analog frequency divider and at least one digital frequency divider. Also, a first input terminal of the MMFD circuitry 1302 is coupled to the output terminal of the VCO circuitry 210. In the example of FIG. 13, a second input terminal of the MMFD circuitry 1302 is coupled to an output terminal of the DSM circuitry 1304. Also, an output terminal of the MMFD circuitry 1302 is coupled to a first input terminal of the DSM circuitry 1304, a second input terminal of the quantization extraction circuitry 1308, and the input terminal of the frequency divider circuitry 214.

In the illustrated example of FIG. 13, the VCO output signal has an output frequency ($F_{OUT}$) that is k times the reference frequency ($F_{REF}$). In the example of FIG. 2, k is 18.5. As such, the output frequency of the VCO output signal is 9.25 GHz (e.g., 18.5*500 MHz=9.25 GHz). In the example of FIG. 13, the MMFD circuitry 1302 switches between multiple moduli to divide the frequency of the VCO output signal. For example, the MMFD circuitry 1302 switches between m and m+1 to divide the frequency of the VCO output signal. In the example of FIG. 13, m is set to the largest integer value that is less than or equal to k/N (e.g., m=floor(k/N)). For example, N is the modulus of the frequency divider circuitry 214. In the example of FIG. 13, N is six. As such, m is 3 and the MMFD circuitry 1302 switches between 3 and 4 as the modulus to divide the frequency of the VCO output signal. In the example of FIG. 13, when MMFD circuitry 1302 divides the frequency of the VCO output signal by m, one cycle of the MMFD output signal includes m cycles of the VCO output signal. Also, when MMFD circuitry 1302 divides the frequency of the VCO output signal by m+1, one cycle of the MMFD output signal includes m+1 cycles of the VCO output signal.

In the illustrated example of FIG. 13, the DSM circuitry 1304 generates a DSM output signal responsive to the MMFD output signal and a DSM reference signal. In the example of FIG. 13, the DSM circuitry 1304 is implemented by combinational logic circuitry, sequential logic circuitry, or combinational logic circuitry and sequential logic circuitry. Also, the first input terminal of the DSM circuitry 1304 is coupled to the output terminal of the MMFD circuitry 1302. In the example of FIG. 13, a second input terminal of the DSM circuitry 1304 is coupled to an output terminal of the DSM input generation circuitry 1306. Also, the output terminal of the DSM circuitry 1304 is coupled to the second input terminal of the MMFD circuitry 1302 and a second input terminal of the quantization extraction circuitry 1308.

In the illustrated example of FIG. 13, the DSM circuitry 1304 is a first order DSM. For example, the overclocking factor of the DSM circuitry 1304 corresponds to the order of the DSM circuitry 1304. In the example of FIG. 13, the DSM circuitry 1304 controls which modulus the MMFD circuitry 1302 utilizes to divide the frequency of the VCO output signal. For example, the DSM circuitry 1304 samples the MMFD output signal based on a DSM reference signal generated by the DSM input generation circuitry 1306. In the example of FIG. 13, the DSM circuitry 1304 is clocked at the frequency of the MMFD output signal. For example, the frequency of the MMFD output signal is N times the frequency of the feedback signal (e.g., $F_{MMFD}$=6*500 MHz=3 GHz) to suppress quantization noise. In the example of FIG. 13, the DSM circuitry 1304 generates an oversampled representation of the MMFD output signal to generate the DSM output signal as a bitstream.

In the illustrated example of FIG. 13, the DSM input generation circuitry 1306 generates the DSM reference signal. In the example of FIG. 13, the DSM input generation circuitry 1306 is implemented by combinational logic circuitry, sequential logic circuitry, or combinational logic circuitry and sequential logic circuitry. Also, the output terminal of the DSM input generation circuitry 1306 is coupled to the second input terminal of the DSM circuitry 1304. In the example of FIG. 13, the DSM input generation circuitry 1306 generates the DSM reference signal as a fractional word. For example, the fractional word is set to the difference between k/N and the largest integer value that is less than or equal to k/N. As such, the fractional word is set to 0.0833 (e.g., $DSM_{IN}$=(18.5/6)−floor(18.5/6)=3.0833−3=0.0833).

In the illustrated example of FIG. 13, the quantization extraction circuitry 1308 samples the DSM output signal to generate a first quantization output signal and a second quantization output signal including quantization information present in the MMFD output signal. In the example of FIG. 13, the quantization extraction circuitry 1308 is implemented by delay circuitry as described further herein. Also, a first input terminal of the quantization extraction circuitry 1308 is coupled to the output terminal of the VCO circuitry 210. In the example of FIG. 13, the second input terminal of the quantization extraction circuitry 1308 is coupled to the output terminal of the DSM circuitry 1304. In the example of FIG. 13, a first output terminal and a second output terminal of the quantization extraction circuitry 1308 are coupled to a first input terminal and a second input terminal of the switching circuitry 1310, respectively.

In the illustrated example of FIG. 13, the quantization extraction circuitry 1308 preserves noise shaping present at the output terminal of the MMFD circuitry 1302. For example, rising edges of the MMD output signal include quantization information as determined by the DSM output signal. However, some of the rising edges of MMD output signal are removed after the frequency divider circuitry 214 divides the frequency of the MMFD output signal. Accordingly, the quantization extraction circuitry 1308 preserves (e.g., extracts) quantization information from the DSM output signal. As such, the quantization extraction circuitry 1308 extracts quantization information before the quantization information is removed (e.g., lost) by the frequency divider circuitry 214 dividing the frequency of the MMFD output signal. The quantization extraction circuitry 1308 adds the quantization information as feedback for the clock generation circuitry 116 by providing the quantization information to the adder circuitry 204 via the switching circuitry 1310.

In the illustrated example of FIG. 13, the switching circuitry 1310 couples, decouples, or couples and decouples the quantization extraction circuitry 1308 to the adder circuitry 204 based on the masking signal generated by the masking logic circuitry 218. In the example of FIG. 13, the switching circuitry 1310 is implemented by one or more switches (e.g., transistors, diodes, etc.) and combinational logic circuitry, sequential logic circuitry, or combinational logic circuitry and sequential logic circuitry as described further herein. Also, the first input terminal and the second input terminal of the switching circuitry 1310 are coupled to the first output terminal and the second output terminal of the quantization extraction circuitry 1308, respectively. In the example of FIG. 13, a third input terminal of the switching circuitry 1310 is coupled to the output terminal of the masking logic circuitry 218. Also, a first output terminal and a second output terminal of the switching circuitry 1310 are coupled to the third input terminal and the fourth input terminal of the adder circuitry 204, respectively.

In the illustrated example of FIG. 13, the quantization extraction circuitry 1308 generates positive voltage pulses, negative voltage pulses, or positive voltage pulses and negative voltage pulses based on the DSM output signal. For example, if the DSM output signal is a logic high value, the quantization extraction circuitry 1308 generates a positive voltage pulse that is 0.5 cycles of the VCO output signal wide. Also, for example, if the DSM output signal is a logic low value, the quantization extraction circuitry 1308 generates a negative voltage pulse that is 0.5 cycles of the VCO output signal wide. In the example of FIG. 13, the masking logic circuitry 218 causes the switching circuitry 1310 to couple the third input terminal and the fourth input terminal of the adder circuitry 204 to ground for one cycle of the VCO output signal when there is a rising edge on the feedback signal.

Figure 14:
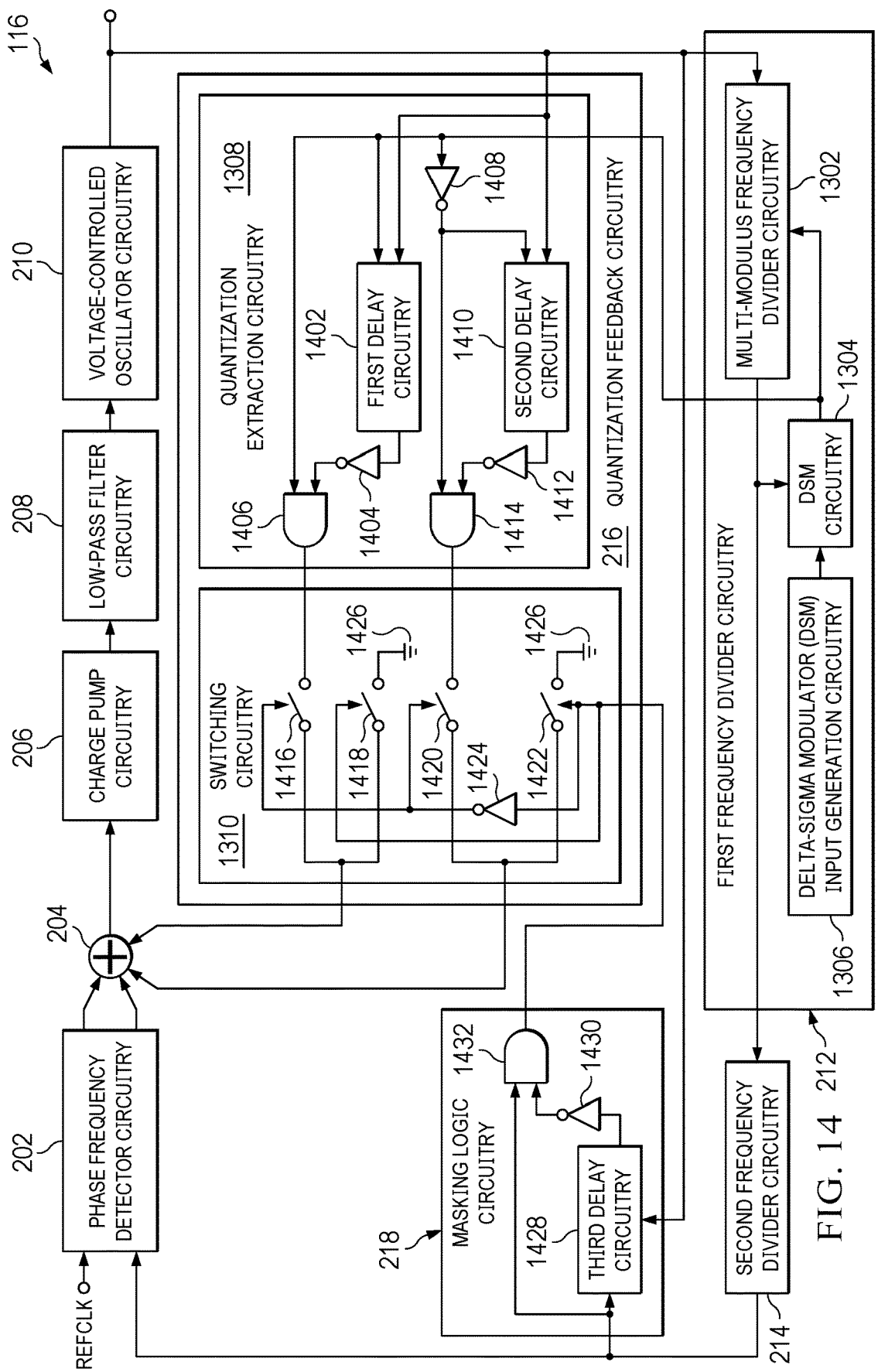
FIG. 14 is a block diagram of the clock generation circuitry of FIG. 13 including an example implementation of the quantization extraction circuitry, the switching circuitry, and the masking logic circuitry of FIG. 13.

FIG. 14 is a block diagram of the clock generation circuitry 116 of FIG. 13 including an example implementation of the quantization extraction circuitry 1308, the switching circuitry 1310, and the masking logic circuitry 218 of FIG. 13. In the example of FIG. 14, the quantization extraction circuitry 1308 includes example first delay circuitry 1402, an example first NOT gate 1404, an example first AND gate 1406, an example second NOT gate 1408, example second delay circuitry 1410, an example third NOT gate 1412, and an example second AND gate 1414. Also, the switching circuitry 1310 includes an example first switch 1416, an example second switch 1418, an example third switch 1420, an example fourth switch 1422, an example fourth NOT gate 1424, and an example ground terminal 1426. In the example of FIG. 14, the masking logic circuitry 218 includes example third delay circuitry 1428, an example fifth NOT gate 1430, and an example third AND gate 1432.

In the illustrated example of FIG. 14, the delay circuitry 1402 delays the DSM output signal by 0.5 clock cycles of the VCO output signal. In the example of FIG. 14, the delay circuitry 1402 is implemented by a D flipflop clocked by falling edges of the VCO output signal. Also, a first input terminal of the delay circuitry 1402 is coupled to the output terminal of the VCO circuitry 210. In the example of FIG. 14, a second input terminal of the delay circuitry 1402 is coupled to the output terminal of the DSM circuitry 1304. In the example of FIG. 14, an output terminal of the delay circuitry 1402 is coupled to an input terminal of the NOT gate 1404.

In the illustrated example of FIG. 14, the NOT gate 1404 is implemented by one or more transistors. In the example of FIG. 14, the input terminal of the NOT gate 1404 is coupled to the output terminal of the delay circuitry 1402. Also, the output terminal of the NOT gate 1404 is coupled to a second input terminal of the AND gate 1406. In the illustrated example of FIG. 14, the AND gate 1406 is implemented by one or more transistors. In the example of FIG. 14, a first input terminal of the AND gate 1406 is coupled to the output terminal of the DSM circuitry 1304. Also, the second input terminal of the AND gate 1406 is coupled to the output terminal of the NOT gate 1404. In the example of FIG. 14, the output terminal of the AND gate 1406 is coupled to a first terminal of the switch 1416.

In the illustrated example of FIG. 14, the NOT gate 1408 is implemented by one or more transistors. In the example of FIG. 14, an input terminal of the NOT gate 1408 is coupled to the output terminal of the DSM circuitry 1304. Also, an output terminal of the NOT gate 1408 is coupled to a second input terminal of the delay circuitry 1410 and a first input terminal of the AND gate 1414. In the example of FIG. 14, the delay circuitry 1410 delays the DSM output signal by 0.5 clock cycles of the VCO output signal. In the example of FIG. 14, the delay circuitry 1410 is implemented by a D flipflop clocked by falling edges of the VCO output signal. Also, a first input terminal of the delay circuitry 1410 is coupled to the output terminal of the VCO circuitry 210. In the example of FIG. 14, the second input terminal of the delay circuitry 1410 is coupled to the output terminal of the NOT gate 1408. In the example of FIG. 14, an output terminal of the delay circuitry 1410 is coupled to an input terminal of the NOT gate 1412.

In the illustrated example of FIG. 14, the NOT gate 1412 is implemented by one or more transistors. In the example of FIG. 14, the input terminal of the NOT gate 1412 is coupled to the output terminal of the delay circuitry 1410. Also, the output terminal of the NOT gate 1412 is coupled to a second input terminal of the AND gate 1414. In the illustrated example of FIG. 14, the AND gate 1414 is implemented by one or more transistors. In the example of FIG. 14, the first input terminal of the AND gate 1414 is coupled to the output terminal of the NOT gate 1408. Also, the second input terminal of the AND gate 1414 is coupled to the output terminal of the NOT gate 1412. In the example of FIG. 14, the output terminal of the AND gate 1414 is coupled to a first terminal of the switch 1420.

In the illustrated example of FIG. 14, the switch 1416 is implemented by a transistor. In the example of FIG. 14, the first terminal of the switch 1416 is coupled to the output terminal of the AND gate 1406. Also, a second terminal of the switch 1416 is coupled to the fourth input terminal of the adder circuitry 204. In the example of FIG. 14, a control terminal of the switch 1416 is coupled to an output terminal of the NOT gate 1424. In the example of FIG. 14, the switch 1418 is implemented by a transistor. Also, a first terminal of the switch 1418 is coupled to the ground terminal 1426. In the example of FIG. 14, a second terminal of the switch 1418 is coupled to the fourth input terminal of the adder circuitry 204. Also, a control terminal of the switch 1418 is coupled to an output terminal of the AND gate 1432.

In the illustrated example of FIG. 14, the switch 1420 is implemented by a transistor. In the example of FIG. 14, the first terminal of the switch 1420 is coupled to the output terminal of the AND gate 1414. Also, a second terminal of the switch 1420 is coupled to the third input terminal of the adder circuitry 204. In the example of FIG. 14, a control terminal of the switch 1420 is coupled to the output terminal of the NOT gate 1424. Also, the switch 1422 is implemented by a transistor. In the example of FIG. 14, a first terminal of the switch 1422 is coupled to the ground terminal 1426.

Also, a second terminal of the switch 1422 is coupled to the third input terminal of the adder circuitry 204. In the example of FIG. 14, a control terminal of the switch 1422 is coupled to the output terminal of the AND gate 1432. Also, the NOT gate 1424 is implemented by one or more transistors. In the example of FIG. 14, an input terminal of the NOT gate 1424 is coupled to the output terminal of the AND gate 1432. Also, the output terminal of the NOT gate 1424 is coupled to the control terminal of the switch 1416 and the control terminal of the switch 1420.

In the illustrated example of FIG. 14, the delay circuitry 1428 delays the feedback signal by 1 clock cycles of the VCO output signal. In the example of FIG. 14, the delay circuitry 1428 is implemented by a D flipflop clocked by rising edges of the VCO output signal. Also, a first input terminal of the delay circuitry 1428 is coupled to the output terminal of the VCO circuitry 210. In the example of FIG. 14, a second input terminal of the delay circuitry 1428 is coupled to the output terminal of the frequency divider circuitry 214. Also, an output terminal of the delay circuitry 1428 is coupled to an input terminal of the NOT gate 1430.

In the illustrated example of FIG. 14, the NOT gate 1430 is implemented by one or more transistors. In the example of FIG. 14, the input terminal of the NOT gate 1430 is coupled to the output terminal of the delay circuitry 1428. Also, an output terminal of the NOT gate 1430 is coupled to a second input terminal of the AND gate 1432. In the example of FIG. 14, the AND gate 1432 is implemented by one or more transistors. Also, a first input terminal of the AND gate 1432 is coupled to the output terminal of the frequency divider circuitry 214. In the example of FIG. 14, the second input terminal of the AND gate 1432 is coupled to the output terminal of the NOT gate 1430. Also, the output terminal of the AND gate 1432 is coupled to the control terminal of the switch 1418, the control terminal of the switch 1422, and the input terminal of the NOT gate 1424.

In the illustrated example of FIG. 14, the AND gate 1406 of the quantization extraction circuitry 1308 generates a positive voltage pulse that is 0.5 cycles of the VCO output signal wide when the DSM output signal is a logic high value. Also, the AND gate 1414 of the quantization extraction circuitry 1308 generates a negative voltage pulse that is 0.5 cycles of the VCO output signal wide when the DSM output signal a logic low value. In the example of FIG. 14, when there is a rising edge on the feedback signal, the AND gate 1432 of the masking logic circuitry 218 causes the switch 1418 and the switch 1422 to couple fourth input terminal and the third input terminal of the adder circuitry 204 to ground, respectively, for one cycle of the VCO output signal. Otherwise, the switch 1416 and the switch 1420 couple the positive voltage pulse, the negative voltage pulse, or the positive voltage pulse and the negative voltage pulse to the fourth input terminal and the third input terminal of the adder circuitry 204, respectively.

While example manners of implementing the frequency divider circuitry 212, the quantization feedback circuitry 216, and the masking logic circuitry 218 are illustrated in FIGS. 13 and 14, one or more of the elements, processes, or devices illustrated in FIGS. 13 and 14 may be at least one of combined, divided, re-arranged, omitted, eliminated, or implemented in any other way. Further, the example MMFD circuitry 1302, the example DSM circuitry 1304, the example DSM input generation circuitry 1306, or, more generally, the example frequency divider circuitry 212 of FIGS. 13 and 14, or the example delay circuitry 1402, the example NOT gate 1404, the example AND gate 1406, the example NOT gate 1408, the example delay circuitry 1410, the example NOT gate 1412, the example AND gate 1414, or, more generally, the quantization extraction circuitry 1308 of FIG. 14, or the example switch 1416, the example switch 1418, the example switch 1420, the example switch 1422, the example NOT gate 1424, or, more generally, the example switching circuitry 1310 of FIG. 14, or the example delay circuitry 1428, the example NOT gate 1430, the example AND gate 1432, or, more generally, the example masking logic circuitry 218 of FIG. 14, may be implemented by hardware alone or by hardware in combination with at least one of software or firmware.

Thus, for example, any of the example MMFD circuitry 1302, the example DSM circuitry 1304, the example DSM input generation circuitry 1306, or, more generally, the example frequency divider circuitry 212 of FIGS. 13 and 14, or the example delay circuitry 1402, the example NOT gate 1404, the example AND gate 1406, the example NOT gate 1408, the example delay circuitry 1410, the example NOT gate 1412, the example AND gate 1414, or, more generally, the quantization extraction circuitry 1308 of FIG. 14, or the example switch 1416, the example switch 1418, the example switch 1420, the example switch 1422, the example NOT gate 1424, or, more generally, the example switching circuitry 1310 of FIG. 14, or the example delay circuitry 1428, the example NOT gate 1430, the example AND gate 1432, or, more generally, the example masking logic circuitry 218 of FIG. 14, could be implemented by at least one of programmable circuitry in combination with machine-readable instructions (e.g., firmware or software), processor circuitry, analog circuit(s), digital circuit(s), logic circuit(s), programmable processor(s), programmable microcontroller(s), graphics processing unit(s) (GPU(s)), digital signal processor(s) (DSP(s)), ASIC(s), programmable logic device(s) (PLD(s)), or field programmable logic device(s) (FPLD(s)) such as FPGAs.

Further still, the example frequency divider circuitry 212 of FIGS. 13 and 14, the example quantization extraction circuitry 1308 of FIGS. 13 and 14, the example switching circuitry 1310 of FIGS. 13 and 14, or, more generally, the quantization feedback circuitry 216 of FIGS. 13 and 14, or the example masking logic circuitry 218 of FIG. 14 may include one or more elements, processes, or devices in addition to, or instead of, those illustrated in FIGS. 13 and 14, and may include more than one of any or all of the illustrated elements, processes, and devices.

Figure 15:
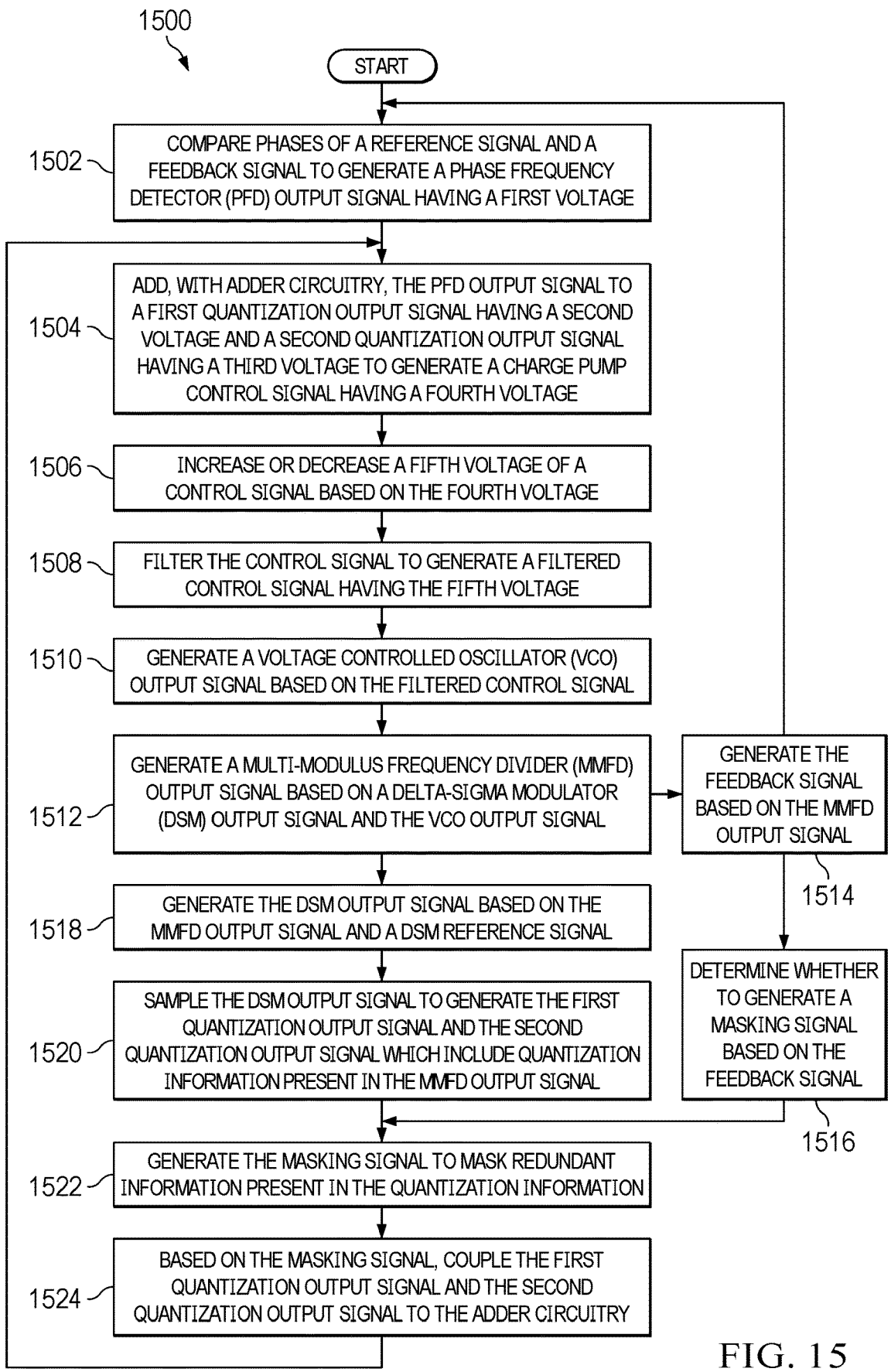
FIG. 15 is a flowchart representative of example machine-readable instructions or example operations that may be executed, instantiated, or performed using an example programmable circuitry implementation of the clock generation circuitry of FIG. 13.

FIG. 15 is a flowchart representative of example machine-readable instructions or example operations 1500 that may be executed, instantiated, or performed using an example programmable circuitry implementation of the clock generation circuitry 116 of FIG. 13. The example machine-readable instructions or the example operations 1500 of FIG. 15 begin at block 1502, at which the PFD circuitry 202 compares phases of a reference signal and a feedback signal to generate a PFD output signal having a first voltage. At block 1504, the adder circuitry 204 adds the PFD output signal to a first quantization output signal having a second voltage and a second quantization output signal having a third voltage. For example, the adder circuitry 204 adds the PFD output signal to the first quantization output signal and the second quantization output signal to generate a charge pump control signal having a fourth voltage.

In the illustrated example of FIG. 15, at block 1506, the charge pump circuitry 206 increases or decreases a fifth voltage of a control signal based on the fourth voltage of the charge pump control signal. At block 1508, the low-pass filter circuitry 208 filters the control signal to generate a filtered control signal having the fifth voltage. In the example of FIG. 15, the VCO circuitry 210 generates a VCO output signal based on the filtered control signal at block 1510. At block 1512, the MMFD circuitry 1302 generates an MMFD output signal based on a DSM output signal and the VCO output signal.

In the illustrated example of FIG. 15, at block 1514, the frequency divider circuitry 214 generates the feedback signal based on the MMFD output signal. After block 1514, the PFD circuitry 202 compares phases of the reference signal and the feedback signal at block 1502 to generate a PFD output signal having a first voltage. Also, after block 1514, the masking logic circuitry 218 determines whether to generate a masking signal based on the feedback signal at block 1516.

In the illustrated example of FIG. 15, at block 1518, the DSM circuitry 1304 generates the DSM output signal based on the MMFD output signal and a DSM reference signal. At block 1520, the quantization extraction circuitry 1308 samples the DSM output signal to generate the first quantization output signal and the second quantization output signal which include quantization information present in the MMFD output signal. In the example of FIG. 15, at block 1522, the masking logic circuitry 218 generates the masking logic signal to mask redundant information present in the quantization information. For example, redundant information is indicative of rising edges present in the MMFD output signal and the feedback signal. At block 1524, based on the masking signal, the switching circuitry 1310 couples the first quantization output signal and the second quantization output signal to the adder circuitry 204. After block 1524, the adder circuitry 204 adds the PFD output signal to the first quantization output signal and the second quantization output signal to generate the charge pump control signal having the fourth voltage.

Flowcharts representative of example machine-readable instructions, which may be executed by programmable circuitry to implement or instantiate the clock generation circuitry 116 of at least one of FIG. 2, 7, 8, 13, or 14 or representative of example operations which may be performed by programmable circuitry to implement or instantiate the clock generation circuitry 116 of at least one of FIG. 2, 7, 8, 13, or 14, are shown in FIGS. 3, 9, and 15. The machine-readable instructions may be one or more executable programs or portion(s) of one or more executable programs for execution by programmable circuitry such as the programmable circuitry 1612 shown in the example programmable circuitry platform 1600 described below in connection with FIG. 16 or may be one or more function(s) or portion(s) of functions to be performed by the example programmable circuitry (e.g., an FPGA). In some examples, the machine-readable instructions cause an operation, a task, etc., to be carried out or performed in an automated manner in the real world. As used herein, "automated" means without human involvement.

The program may be embodied in instructions (e.g., at least one of software or firmware) stored on one or more non-transitory computer-readable or machine-readable storage medium such as cache memory, a magnetic-storage device or disk (e.g., a floppy disk, a Hard Disk Drive (HDD), etc.), an optical-storage device or disk (e.g., a Blu-ray disk, a Compact Disk (CD), a Digital Versatile Disk (DVD), etc.), a Redundant Array of Independent Disks (RAID), a register, ROM, a solid-state drive (SSD), SSD memory, non-volatile memory (e.g., electrically erasable programmable read-only memory (EEPROM), flash memory, etc.), volatile memory (e.g., Random Access Memory (RAM) of any type, etc.), or any other storage device or storage disk. The instructions of the non-transitory computer-readable or machine-readable medium may program, be executed by, or program and be executed by programmable circuitry located in one or more hardware devices, but the entire program or parts thereof could alternatively be executed or instantiated by one or more hardware devices other than the programmable circuitry or embodied in dedicated hardware. The machine-readable instructions may be distributed across multiple hardware devices or executed by two or more hardware devices (e.g., a server and a client hardware device). For example, the client hardware device may be implemented by an endpoint client hardware device (e.g., a hardware device associated with a human or machine user) or an intermediate client hardware device gateway (e.g., a radio access network (RAN)) that may facilitate communication between a server and an endpoint client hardware device. Similarly, the non-transitory computer-readable storage medium may include one or more mediums. Further, although the example program is described with reference to the flowchart(s) illustrated in FIGS. 3, 9, and 15, many other methods of implementing the example clock generation circuitry 116 may alternatively be used. For example, the order of execution of the blocks of the flowchart(s) may be changed, or some of the blocks described may be changed, eliminated, or combined. In some examples, any or all of the blocks of the flow chart may be implemented by one or more hardware circuits (e.g., at least one of processor circuitry, discrete analog circuitry, discrete digital circuitry, integrated analog circuitry, integrated digital circuitry, an FPGA, an ASIC, a comparator, an operational-amplifier (op-amp), a logic circuit, etc.) structured to perform the corresponding operation without executing software or firmware. The programmable circuitry may be distributed in different network locations or local to one or more hardware devices (e.g., a single-core processor (e.g., a single core CPU), a multi-core processor (e.g., a multi-core CPU, an XPU, etc.)). For example, the programmable circuitry may be a CPU or an FPGA located in the same package (e.g., the same integrated circuit (IC) package or in two or more separate housings), one or more processors in a single machine, multiple processors distributed across multiple servers of a server rack, multiple processors distributed across one or more server racks, etc., or any combination(s) thereof.

The machine-readable instructions described herein may be stored in one or more of a compressed format, an encrypted format, a fragmented format, a compiled format, an executable format, a packaged format, etc. Machine-readable instructions as described herein may be stored as data (e.g., computer-readable data, machine-readable data, one or more bits (e.g., one or more computer-readable bits, one or more machine-readable bits, etc.), a bitstream (e.g., a computer-readable bitstream, a machine-readable bitstream, etc.), etc.) or a data structure (e.g., as portion(s) of instructions, code, representations of code, etc.) that may be utilized to create, manufacture, or produce machine-executable instructions. For example, the machine-readable instructions may be fragmented and stored on one or more storage devices, disks or computing devices (e.g., servers) located at the same or different locations of a network or collection of networks (e.g., in the cloud, in edge devices, etc.). The machine-readable instructions may require one or more of installation, modification, adaptation, updating, combining, supplementing, configuring, decryption, decompression, unpacking, distribution, reassignment, compilation, etc., in order to make them directly readable, interpretable, or executable by a computing device or other machine. For example, the machine-readable instructions may be stored in multiple parts, which are individually compressed, encrypted, or stored on separate computing devices. The parts when decrypted, decompressed, or combined form a set of computer-executable or machine-executable instructions that implement one or more functions or operations that may together form a program such as that described herein.

In another example, the machine-readable instructions may be stored in a state in which they may be read by programmable circuitry, but require addition of a library (e.g., a dynamic link library (DLL)), a software development kit (SDK), an application programming interface (API), etc., in order to execute the machine-readable instructions on a particular computing device or other device. In another example, the machine-readable instructions may need to be configured (e.g., settings stored, data input, network addresses recorded, etc.) before the machine-readable instructions or the corresponding program(s) can be executed in whole or in part. Thus, machine-readable, computer-readable, or machine-readable media, as used herein, may include instructions or program(s) regardless of the particular format or state of the machine-readable instructions or program(s).

The machine-readable instructions described herein can be represented by any past, present, or future instruction language, scripting language, programming language, etc. For example, the machine-readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 3, 9, and 15 may be implemented using executable instructions (e.g., computer-readable or machine-readable instructions) stored on one or more non-transitory computer-readable or machine-readable media. As used herein, the terms non-transitory computer-readable medium, non-transitory computer-readable storage medium, non-transitory machine-readable medium, and non-transitory machine-readable storage medium are expressly defined to include any type of computer-readable storage device or storage disk and to exclude propagating signals and to exclude transmission media. Examples of such non-transitory computer-readable medium, non-transitory computer-readable storage medium, non-transitory machine-readable medium, and non-transitory machine-readable storage medium include optical storage devices, magnetic storage devices, an HDD, a flash memory, a read-only memory (ROM), a CD, a DVD, a cache, a RAM of any type, a register, and any other storage device or storage disk in which information is stored for any duration (e.g., for extended time periods, permanently, for brief instances, for temporarily buffering, or for caching of the information). As used herein, the terms "non-transitory computer-readable storage device" and "non-transitory machine-readable storage device" are defined to include any physical (e.g., mechanical, magnetic electrical, etc.) hardware to retain information for a time period, but to exclude propagating signals and to exclude transmission media. Examples of non-transitory computer-readable storage devices and non-transitory machine-readable storage devices include random access memory of any type, read only memory of any type, solid state memory, flash memory, optical discs, magnetic disks, disk drives, and redundant array of independent disks (RAID) systems. As used herein, the term "device" refers to physical structure such as mechanical or electrical equipment, hardware, or circuitry that may or may not be configured by computer-readable instructions, machine-readable instructions, etc., or manufactured to execute computer-readable instructions, machine-readable instructions, etc.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended.

As used herein, singular references (e.g., "a," "an," "first," "second," etc.) do not exclude a plurality. The term "a" or "an" object, as used herein, refers to one or more of that object. The terms "a" (or "an"), "one or more," and "at least one" are used interchangeably herein. Furthermore, although individually listed, a plurality of means, elements, or actions may be implemented by, e.g., the same entity or object. Also, although individual features may be included in different examples or claims, these may possibly be combined, and the inclusion in different examples or claims does not imply that a combination of features is not feasible or advantageous.

Figure 16:
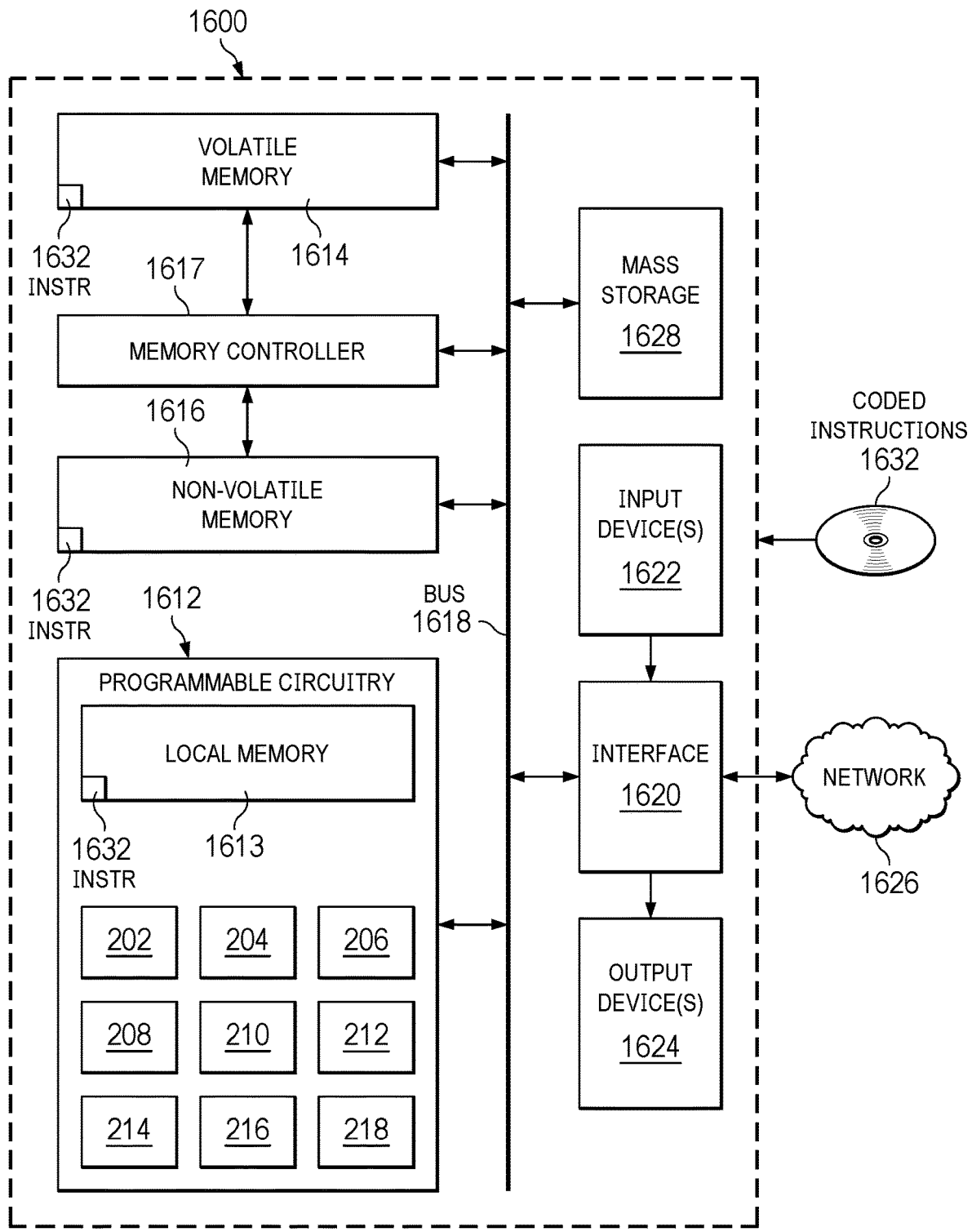
FIG. 16 is a block diagram of an example processing platform including programmable circuitry structured to execute, instantiate, or perform the example machine-readable instructions or perform the example operations of at least one of FIG. 3, 9, or 15 to implement the clock generation circuitry of at least one of FIG. 2, 7, 8, 13, or 14.

FIG. 16 is a block diagram of an example programmable circuitry platform 1600 structured to execute or instantiate the example machine-readable instructions or the example operations of at least one of FIG. 3, 9, or 15 to implement the clock generation circuitry 116 of at least one of FIG. 2, 7, 8, 13, or 14. The programmable circuitry platform 1600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing or electronic device.

The programmable circuitry platform 1600 of the illustrated example includes programmable circuitry 1612. The programmable circuitry 1612 of the illustrated example is hardware. For example, the programmable circuitry 1612 can be implemented by one or more integrated circuits, logic circuits, FPGAs, microprocessors, CPUs, GPUs, DSPs, or microcontrollers from any desired family or manufacturer. The programmable circuitry 1612 may be implemented by one or more semiconductor based (e.g., silicon based) devices. In this example, the programmable circuitry 1612 implements the example PFD circuitry 202, the example adder circuitry 204, the example charge pump circuitry 206, the example low-pass filter circuitry 208, the example VCO circuitry 210, the example frequency divider circuitry 212, the example frequency divider circuitry 214, the example quantization feedback circuitry 216, the example masking logic circuitry 218, or, more generally, the example clock generation circuitry 116 of FIG. 2.

The programmable circuitry 1612 of the illustrated example includes a local memory 1613 (e.g., a cache, registers, etc.). The programmable circuitry 1612 of the illustrated example is in communication with main memory 1614, 1616, which includes a volatile memory 1614 and a non-volatile memory 1616, by a bus 1618. The volatile memory 1614 may be implemented by at least one of Synchronous Dynamic Random Access Memory (SDRAM), Dynamic Random Access Memory (DRAM), RAMBUS® Dynamic Random Access Memory (RDRAM®), or any other type of RAM device. The non-volatile memory 1616 may be implemented by at least one of flash memory or any other desired type of memory device. Access to the main memory 1614, 1616 of the illustrated example is controlled by a memory controller 1617. In some examples, the memory controller 1617 may be implemented by one or more integrated circuits, logic circuits, microcontrollers from any desired family or manufacturer, or any other type of circuitry to manage the flow of data going to and from the main memory 1614, 1616.

The programmable circuitry platform 1600 of the illustrated example also includes interface circuitry 1620. The interface circuitry 1620 may be implemented by hardware using any type of interface standard, such as an Ethernet interface, a universal serial bus (USB) interface, a Bluetooth® interface, a near field communication (NFC) interface, a Peripheral Component Interconnect (PCI) interface, or a Peripheral Component Interconnect Express (PCIe) interface.

In the illustrated example, one or more input devices 1622 are connected to the interface circuitry 1620. The input device(s) 1622 permit(s) a user (e.g., a human user, a machine user, etc.) to enter data or commands into the programmable circuitry 1612. The input device(s) 1622 can be implemented by, for example, an audio sensor, a microphone, a camera (still or video), a keyboard, a button, a mouse, a touchscreen, a trackpad, a trackball, an isopoint device, or a voice recognition system.

One or more output devices 1624 are also connected to the interface circuitry 1620 of the illustrated example. The output device(s) 1624 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, or speaker. The interface circuitry 1620 of the illustrated example, thus, may include a graphics driver card, a graphics driver chip, or graphics processor circuitry such as a GPU.

The interface circuitry 1620 of the illustrated example also includes a communication device such as a transmitter, a receiver, a transceiver, a modem, a residential gateway, a wireless access point, or a network interface to facilitate exchange of data with external machines (e.g., computing devices of any kind) by a network 1626. The communication can be by, for example, an Ethernet connection, a digital subscriber line (DSL) connection, a telephone line connection, a coaxial cable system, a satellite system, a beyond-line-of-sight wireless system, a line-of-sight wireless system, a cellular telephone system, an optical connection, etc.

The programmable circuitry platform 1600 of the illustrated example also includes one or more mass storage discs or devices 1628 to store at least one of firmware, software, or data. Examples of such mass storage discs or devices 1628 include magnetic storage devices (e.g., floppy disk, drives, HDDs, etc.), optical storage devices (e.g., Blu-ray disks, CDs, DVDs, etc.), RAID systems, or solid-state storage discs or devices such as flash memory devices or SSDs.

The machine-readable instructions 1632, which may be implemented by the machine-readable instructions of at least one of FIG. 3, 9, or 15, may be stored in at least one of the mass storage device 1628, the volatile memory 1614, the non-volatile memory 1616, or on at least one non-transitory computer-readable storage medium such as a CD or DVD which may be removable.

In this description, the phrase "at least one of A or B" (or "at least one of A and B") refers to implementations including any of: (a) at least one A; (b) at least one B; and (c) at least one A and at least one B.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Numerical identifiers such as "first," "second," "third," etc. are used merely to distinguish between elements of substantially the same type in terms of structure or function. These identifiers, as used in the detailed description, do not necessarily align with those used in the claims.

A device that is "configured to" perform a task or function may be configured (e.g., programmed or hardwired) at a time of manufacturing by a manufacturer to perform the function or may be configurable (or re-configurable) by a user after manufacturing to perform the function or other additional or alternative functions. The configuring may be through at least one of firmware or software programming of the device, through at least one of a construction or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including at least one of one or more semiconductor elements (such as transistors), one or more passive elements (e.g., resistors, capacitors, inductors, etc.), or one or more sources (e.g., voltage sources, current sources, etc.) may instead include only the semiconductor elements within a single physical device (e.g., a semiconductor die, an integrated circuit (IC) package, etc.) and may be adapted to be coupled to at least some of the passive elements or the sources to form the described structure either at a time of manufacture or after a time of manufacture, for example, by an end-user or a third-party.

Circuits described herein are reconfigurable to include the replaced components to provide functionality at least partially similar to functionality available prior to the component replacement. Components shown as resistors, unless otherwise stated, are generally representative of any one or more elements coupled in series or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor. While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; or (iv) incorporated in/on the same printed circuit board.

Uses of the phrase "ground" in the foregoing description include a chassis ground, an Earth ground, a floating ground, a virtual ground, a digital ground, a common ground, or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero.

Modifications are possible in the described embodiments, and other embodiments are possible, within the scope of the claims.

From the foregoing, it will be appreciated that example systems, apparatus, articles of manufacture, and methods have been described that use quantization extraction in phase-locked loop oscillators. Described systems, apparatus, articles of manufacture, and methods achieve phase noise performance similar to that found in integer PLLs of similar bandwidth and reduce the effect of quantization noise to negligible. Furthermore, described examples do not cause charge pump circuitry of PLLs to operate in non-linear regions. Examples described herein also consume less area on a semiconductor die and less power than other techniques. Also, examples described herein maintain quantization noise shaping even when delays are mismatched in transmission paths between circuitry. Furthermore, examples described herein utilize one integer divider in the feedback path.

Also, described systems, apparatus, articles of manufacture, and methods are resilient to any shaped noise folding. Examples described herein improve inherent noise performance of VCO circuitry of PLLs and achieve no or very low LCM reference spurs. Also, examples described herein are not dependent on the duty cycle of a clock signal. Described systems, apparatus, articles of manufacture, and methods improve the efficiency of using a computing device by consuming less area on a semiconductor die and less power than other techniques. Described systems, apparatus, articles of manufacture, and methods are accordingly directed to one or more improvement(s) in the operation of a machine such as a computer or other electronic or mechanical device.

The following claims are hereby incorporated into this Detailed Description by this reference. Although certain example systems, apparatus, articles of manufacture, and methods have been described herein, the scope of coverage of this patent is not limited thereto. On the contrary, this patent covers all systems, apparatus, articles of manufacture, and methods fairly falling within the scope of the claims of this patent.

What is claimed is:

1. An apparatus comprising:
voltage-controlled oscillator (VCO) circuitry including an output terminal and an input terminal;
first frequency divider circuitry including a first output terminal, a second output terminal, and an input terminal coupled to the output terminal of the VCO circuitry;
quantization feedback circuitry including an output terminal, a first input terminal, a second input terminal, and a third input terminal, the first input terminal of the quantization feedback circuitry coupled to the output terminal of the VCO circuitry, the second input terminal of the quantization feedback circuitry coupled to the first output terminal of the first frequency divider circuitry;
second frequency divider circuitry including an output terminal and an input terminal coupled to the second output terminal of the first frequency divider circuitry;
phase frequency detector (PFD) circuitry including an output terminal and an input terminal coupled to the output terminal of the second frequency divider circuitry;
masking logic circuitry including an output terminal coupled to the third input terminal of the quantization feedback circuitry, a first input terminal coupled to the output terminal of the VCO circuitry, and a second input terminal coupled to the output terminal of the second frequency divider circuitry; and
adder circuitry including an output terminal coupled to the input terminal of the VCO circuitry, a first input terminal coupled to the output terminal of the PFD circuitry, and a second input terminal coupled to the output terminal of the quantization feedback circuitry.

2. The apparatus of claim 1, wherein:
the PFD circuitry is first PFD circuitry;
the quantization feedback circuitry includes quantization extraction circuitry, switching circuitry, and second PFD circuitry;
the quantization extraction circuitry includes an output terminal, a first input terminal coupled to the output terminal of the VCO circuitry, and a second input terminal coupled to the first output terminal of the first frequency divider circuitry;
the switching circuitry includes an output terminal, a first input terminal coupled to the output terminal of the quantization extraction circuitry, and a second input terminal coupled to the output terminal of the masking logic circuitry; and
the second PFD circuitry includes an output terminal coupled to the second input terminal of the adder circuitry and an input terminal coupled to the output terminal of the switching circuitry.

3. The apparatus of claim 1, wherein:
the quantization feedback circuitry includes quantization extraction circuitry and switching circuitry;
the quantization extraction circuitry includes an output terminal, a first input terminal coupled to the output terminal of the VCO circuitry, and a second input terminal coupled to the first output terminal of the first frequency divider circuitry; and
the switching circuitry includes an output terminal coupled to the second input terminal of the adder circuitry, a first input terminal coupled to the output terminal of the quantization extraction circuitry, and a second input terminal coupled to the output terminal of the masking logic circuitry.

4. The apparatus of claim 1, further including:
charge pump circuitry including an output terminal and an input terminal coupled to the output terminal of the adder circuitry; and low-pass filter circuitry including an output terminal coupled to the input terminal of the VCO circuitry and an input terminal coupled to the output terminal of the charge pump circuitry.

5. The apparatus of claim 1, wherein the input terminal of the PFD circuitry is a first input terminal, and the PFD circuitry includes a second input terminal to be coupled to an oscillator.

6. An apparatus comprising:
voltage-controlled oscillator (VCO) circuitry including an output terminal and an input terminal;
multi-modulus frequency divider (MMFD) circuitry including an output terminal and an input terminal coupled to the output terminal of the VCO circuitry;
second frequency divider circuitry including an output terminal and an input terminal coupled to the output terminal of the MMFD circuitry;
first phase frequency detector (PFD) circuitry including an output terminal and an input terminal coupled to the output terminal of the second frequency divider circuitry;
quantization extraction circuitry including an output terminal, a first input terminal coupled to the output terminal of the VCO circuitry, and a second input terminal coupled to the output terminal of the MMFD circuitry;
switching circuitry including an output terminal, a first input terminal, and a second input terminal, the first input terminal of the switching circuitry coupled to the output terminal of the quantization extraction circuitry;
second PFD circuitry including an output terminal and an input terminal coupled to the output terminal of the switching circuitry;
masking logic circuitry including an output terminal coupled to the second input terminal of the switching circuitry, a first input terminal coupled to the output terminal of the VCO circuitry, and a second input terminal coupled to the output terminal of the second frequency divider circuitry; and
adder circuitry including an output terminal coupled to the input terminal of the VCO circuitry, a first input terminal coupled to the output terminal of the first PFD circuitry, and a second input terminal coupled to the output terminal of the second PFD circuitry.

7. The apparatus of claim 6, wherein:
the masking logic circuitry includes delay circuitry and an AND gate;
the delay circuitry includes an output terminal, a first input terminal coupled to the output terminal of the VCO circuitry, and a second input terminal coupled to the output terminal of the second frequency divider circuitry; and
the AND gate includes an output terminal coupled to the second input terminal of the switching circuitry, a first input terminal coupled to the output terminal of the second frequency divider circuitry, and a second input terminal coupled to the output terminal of the delay circuitry.

8. The apparatus of claim 6, wherein:
the quantization extraction circuitry includes first delay circuitry and second delay circuitry;
the first delay circuitry includes a first input terminal coupled to the output terminal of the VCO circuitry and a second input terminal coupled to the output terminal of the MMFD circuitry; and the second delay circuitry includes a first input terminal coupled to the output terminal of the VCO circuitry and a second input terminal coupled to the output terminal of the MMFD circuitry.

9. The apparatus of claim 6, wherein the switching circuitry includes:
a first NOT gate including an output terminal and an input terminal coupled to the output terminal of the masking logic circuitry;
an OR gate including an output terminal, a first input terminal coupled to the output terminal of first NOT gate, and a second input terminal coupled to the output terminal of the masking logic circuitry; and
a second NOT gate including an output terminal and an input terminal coupled to the output terminal of the OR gate.

10. The apparatus of claim 9, wherein the output terminal of the quantization extraction circuitry is a first output terminal, the input terminal of the second PFD circuitry is a first input terminal, and the switching circuitry includes:
a first switch including a first terminal coupled to the first output terminal of the quantization extraction circuitry, a second terminal coupled to the first input terminal of the second PFD circuitry, and a control terminal coupled to the output terminal of the first NOT gate;
a second switch including a first terminal coupled to a second output terminal of the quantization extraction circuitry, a second terminal coupled to the first input terminal of the second PFD circuitry, and a control terminal coupled to the output terminal of the masking logic circuitry;
a third switch including a first terminal coupled to the second output terminal of the quantization extraction circuitry, a second terminal coupled to a second input terminal of the second PFD circuitry, and a control terminal coupled to the output terminal of the OR gate; and
a fourth switch including a first terminal coupled to a ground terminal, a second terminal coupled to the second input terminal of the second PFD circuitry, and a control terminal coupled to the output terminal of the second NOT gate.

11. An apparatus comprising:
voltage-controlled oscillator (VCO) circuitry including an output terminal and an input terminal;
multi-modulus frequency divider (MMFD) circuitry including an output terminal, a first input terminal, and a second input terminal, the first input terminal of the MMFD circuitry coupled to the output terminal of the VCO circuitry;
second frequency divider circuitry including an output terminal and an input terminal coupled to the output terminal of the MMFD circuitry;
phase frequency detector (PFD) circuitry including an output terminal and an input terminal coupled to the output terminal of the second frequency divider circuitry;
delta-sigma modulator (DSM) circuitry including an output terminal coupled to the second input terminal of the MMFD circuitry and an input terminal coupled to the output terminal of the MMFD circuitry;
quantization extraction circuitry including an output terminal, a first input terminal coupled to the output terminal of the VCO circuitry, and a second input terminal coupled to the output terminal of the DSM circuitry;

switching circuitry including an output terminal, a first input terminal, and a second input terminal, the first input terminal of the switching circuitry coupled to the output terminal of the quantization extraction circuitry;

masking logic circuitry including an output terminal coupled to the second input terminal of the switching circuitry, a first input terminal coupled to the output terminal of the VCO circuitry, and a second input terminal coupled to the output terminal of the second frequency divider circuitry; and adder circuitry including an output terminal coupled to the input terminal of the VCO circuitry, a first input terminal coupled to the output terminal of the PFD circuitry, and a second input terminal coupled to the output terminal of the switching circuitry.

12. The apparatus of claim 11, wherein:
the masking logic circuitry includes delay circuitry, an AND gate, and a NOT gate;
the delay circuitry includes an output terminal, a first input terminal coupled to the output terminal of the VCO circuitry, and a second input terminal coupled to the output terminal of the second frequency divider circuitry;
the NOT gate includes an output terminal and an input terminal coupled to the output terminal of the delay circuitry; and
the AND gate includes an output terminal coupled to the second input terminal of the switching circuitry, a first input terminal coupled to the output terminal of the second frequency divider circuitry, and a second input terminal coupled to the output terminal of the NOT gate.

13. The apparatus of claim 11, wherein:
the quantization extraction circuitry includes delay circuitry, a NOT gate, and an AND gate;
the delay circuitry includes an output terminal, a first input terminal coupled to the output terminal of the VCO circuitry, and a second input terminal coupled to the output terminal of the DSM circuitry;
the NOT gate includes an output terminal and an input terminal coupled to the output terminal of the delay circuitry; and
the AND gate includes an output terminal coupled to the first input terminal of the switching circuitry, a first input terminal coupled to the output terminal of the DSM circuitry, a second input terminal coupled to the output terminal of the NOT gate.

14. The apparatus of claim 11, wherein:
the quantization extraction circuitry includes a first NOT gate, delay circuitry, a second NOT gate, and an AND gate;
the first NOT gate includes an output terminal and an input terminal coupled the output terminal of the DSM circuitry;
the delay circuitry includes an output terminal, a first input terminal coupled to the output terminal of the VCO circuitry, and a second input terminal coupled to the output terminal of the first NOT gate;
the second NOT gate includes an output terminal and an input terminal coupled to the output terminal of the delay circuitry; and
the AND gate includes an output terminal coupled to the first input terminal of the switching circuitry, a first input terminal coupled to the output terminal of the first NOT gate, a second input terminal coupled to the output terminal of the second NOT gate.

15. The apparatus of claim 11, wherein the output terminal of the quantization extraction circuitry is a first output terminal, the adder circuitry includes a third input terminal, and the switching circuitry includes:
a NOT gate including an output terminal and an input terminal coupled to the output terminal of the masking logic circuitry;
a first switch including a first terminal coupled to the first output terminal of the quantization extraction circuitry, a second terminal coupled to the second input terminal of the adder circuitry, and a control terminal coupled to the output terminal of the NOT gate;
a second switch including a first terminal coupled to a ground terminal, a second terminal coupled to the second input terminal of the adder circuitry, and a control terminal coupled to the output terminal of the masking logic circuitry;
a third switch including a first terminal coupled to a second output terminal of the quantization extraction circuitry, a second terminal coupled to the third input terminal of the adder circuitry, and a control terminal coupled to the output terminal of the NOT gate; and
a fourth switch including a first terminal coupled to a ground terminal, a second terminal coupled to the third input terminal of the adder circuitry, and a control terminal coupled to the output terminal of the masking logic circuitry.

16. A method comprising:
generating a first quantization feedback signal and a second quantization feedback signal based on a masking signal, the first quantization feedback signal and the second quantization feedback signal to capture quantization information present in a frequency divider output signal; and
generating the masking signal based on a feedback signal, the masking signal to mask redundant information present in the quantization information, the feedback signal based on the frequency divider output signal.

17. The method of claim 16, further including comparing the feedback signal and a delayed feedback signal to generate the masking signal, the delayed feedback signal based on the feedback signal.

18. The method of claim 16, further including:
generating an inverted delayed feedback signal based on the feedback signal; and
comparing the feedback signal and the inverted delayed feedback signal to generate the masking signal.

19. The method of claim 16, wherein the quantization information is indicative of rising edges present in the frequency divider output signal.

20. The method of claim 16, wherein the redundant information is indicative of rising edges present in the frequency divider output signal and the feedback signal.

* * * * *